United States Patent
Tatsumi

(10) Patent No.: US 10,511,274 B2
(45) Date of Patent: Dec. 17, 2019

(54) DRIVER CIRCUIT

(71) Applicant: SUMITOMO ELECTRIC INDUSTRIES, LTD., Osaka (JP)

(72) Inventor: Taizo Tatsumi, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/939,916

(22) Filed: Mar. 29, 2018

(65) Prior Publication Data

US 2018/0287575 A1    Oct. 4, 2018

(30) Foreign Application Priority Data

Mar. 30, 2017   (JP) ................. 2017-068224

(51) Int. Cl.
| | | |
|---|---|---|
| *H03F 3/45* | (2006.01) | |
| *H04B 10/50* | (2013.01) | |
| *H03F 3/60* | (2006.01) | |
| *G02F 1/21* | (2006.01) | |
| *G02F 1/17* | (2019.01) | |

(52) U.S. Cl.
CPC ......... *H03F 3/45085* (2013.01); *H03F 3/605* (2013.01); *H04B 10/505* (2013.01); *G02F 1/17* (2013.01); *G02F 1/21* (2013.01); *G02F 2001/212* (2013.01); *H03F 2203/45116* (2013.01); *H03F 2203/45178* (2013.01); *H03F 2203/45208* (2013.01); *H03F 2203/45391* (2013.01); *H03F 2203/45392* (2013.01); *H03F 2203/45466* (2013.01); *H03F 2203/45612* (2013.01); *H04B 10/50* (2013.01)

(58) Field of Classification Search
CPC ...... H03F 3/45085; H03F 3/605; H01S 5/042; H01S 5/0683; H01S 5/0427

USPC ............... 330/260, 252, 253, 53, 286, 292
See application file for complete search history.

(56) References Cited

U.S. PATENT DOCUMENTS

| | | | | |
|---|---|---|---|---|
| 5,105,163 A | * | 4/1992 | Voorman ............. | H03H 11/126 330/107 |
| 2008/0218257 A1 | * | 9/2008 | Lee ..................... | G11C 27/026 327/561 |
| 2009/0243718 A1 | * | 10/2009 | Bonthron ........... | H03F 3/45089 330/10 |

FOREIGN PATENT DOCUMENTS

| | | |
|---|---|---|
| JP | 09-130170 | 5/1997 |
| JP | 2010-272918 | 12/2010 |

* cited by examiner

*Primary Examiner* — Khanh V Nguyen
*Assistant Examiner* — Khiem D Nguyen
(74) *Attorney, Agent, or Firm* — Smith, Gambrell & Russell, LLP.

(57) ABSTRACT

A traveling wave amplifier includes two input-side lines, two output-side lines, and amplification cells. The amplification cells each include a first input terminal, a second input terminal, a first transistor including a base connected to the first input terminal and a collector connected to one output-side line, a second transistor including a base connected to the second input terminal and a collector connected to the other output-side line, a current source connected to an emitter of each of the two transistors, a first series circuit connected between the collector of the second transistor and the base of the first transistor and including a capacitor and a resistor, and a second series of circuit connected between the collector of the first transistor and the base of the second transistor and including a capacitor and a resistor.

8 Claims, 14 Drawing Sheets

DRIVER CIRCUIT

TECHNICAL FIELD

An aspect of the present invention relates to a driver circuit for amplifying an input signal.

BACKGROUND

An optical transmitter that is used in an optical communication system includes, for example, a light source, an optical modulator, and driver circuit for the optical modulator. A laser diode, other semiconductor laser, or the like is used as the light source. The optical modulator modulates continuous wave (CW) light output from the light source. For example, an electro absorption modulator (EAM), a Mach-Zehnder modulator (MZM), or the like is used as the optical modulator. The driver circuit for the optical modulator supplies a driving signal to the optical modulator.

In an optical transmitter that is used for, for example, high-speed data communication of 28 Gbps or 40 Gbps, a high-speed signal transition with a falling time and a rising time of 10 ps or less is required in an eye pattern of an optical output signal output from the optical transmitter. Further, for an input and an output of a driver circuit for an optical modulator, a small reflection coefficient (S parameters; S11 and S22) up to a frequency of about 20 GHz is required. Therefore, a traveling wave amplifier (TWA) is used in the driver circuit for an optical modulator. The traveling wave amplifier is capable of high-speed operation and is suitable for obtaining a small reflection coefficient up to a high frequency range. In order to improve high frequency characteristics of the traveling wave amplifier, it is necessary for a length of an internal transmission line to be lengthened, but providing a long transmission line is not preferable for miniaturizing the optical transmitter.

SUMMARY

A driver circuit according to an aspect of the present invention is a driver circuit for amplifying two complementary input signals having phases opposite to each other and outputting two complementary output signals having phases opposite to each other, the driver circuit including: an input terminal for receiving the two complementary input signals; a first input-side transmission line for transmitting one of the two complementary input signals; a second input-side transmission line for transmitting another of the two complementary input signals; a first output-side transmission line for transmitting one of the two complementary output signals; a second output-side transmission line for transmitting another of the two complementary output signals; an output terminal for outputting the two complementary output signals; and a differential amplification circuit including a first input terminal electrically connected to the first input-side transmission line, a second input terminal electrically connected to the second input-side transmission line, a first transistor including a control terminal, a first current terminal, and a second current terminal, the control terminal of the first transistor being electrically connected to the first input terminal, and the second current terminal of the first transistor being electrically connected to the second output-side transmission line, a second transistor including a control terminal, a first current terminal, and a second current terminal, the control terminal of the second transistor being electrically connected to the second input terminal, and the second current terminal of the second transistor being electrically connected to the first output-side transmission line, a current source electrically connected to the first current terminal of the first transistor and the first current terminal of the second transistor, a first series circuit having one end electrically connected to the second current terminal of the second transistor and another end electrically connected to the first input terminal, first series circuit including a first capacitor and a first feedback resistance element electrically connected the first capacitor in series, and a second series circuit having one end electrically connected to the second current terminal of the first transistor and another end electrically connected to the second input terminal, the second series circuit including a second capacitor and a second feedback resistance element electrically connected the second capacitor in series.

DETAILED DESCRIPTION

Figure 1:
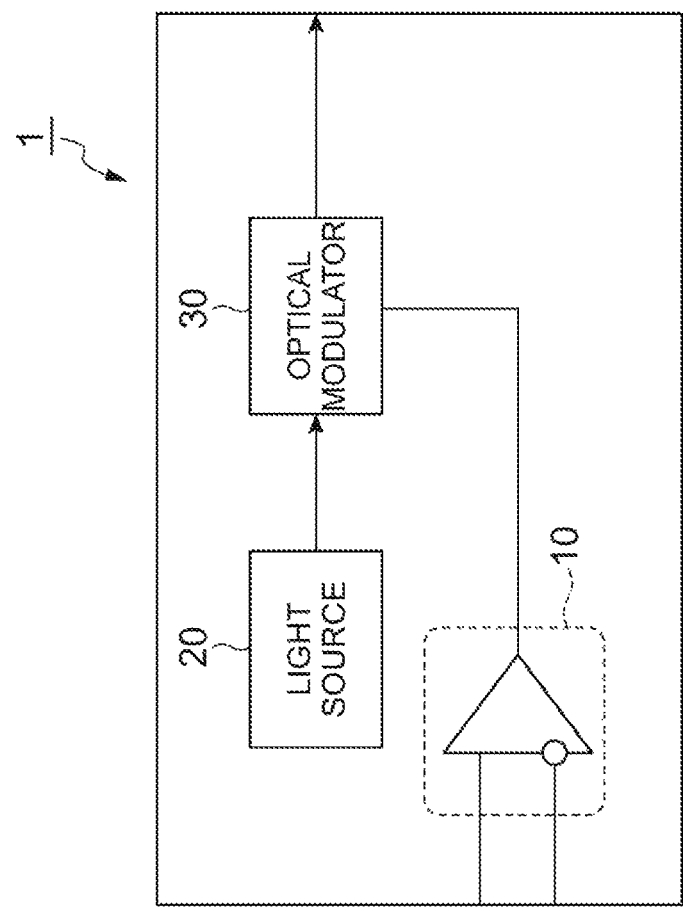
FIG. 1 is a block diagram illustrating a configuration of an optical transmitter into which a driver circuit according to an embodiment is built.

Hereinafter, embodiments of the present invention will be described with reference to the drawings. In the description of the drawings, the same elements are denoted by the same reference numerals, and duplicate description is omitted.

FIG. 1 is a block diagram illustrating a configuration of an optical transmitter into which a driver circuit according to an embodiment is built. As illustrated in FIG. 1, an optical transmitter 1 includes a driver circuit 10, a light source 20, and an optical modulator 30. The optical transmitter 1 is used, for example, in an optical communication device. The light source 20 is, for example, a laser diode. The optical modulator 30 is, for example, an EAM or an MZM. The driver circuit 10 drives the optical modulator 30 using a driving signal. The driver circuit 10 is, for example, a traveling wave amplifier. The optical modulator 30 receives the driving signal and modulates continuous light (CW light) supplied from the light source 20 in accordance with the driving signal.

In the related art, binary amplitude modulation (ON-OFF Keying) using level 0 (an extinction state) and level 1 (a light emission state) of optical signal intensity has been used as a modulation scheme. In recent years, multilevel amplitude modulation schemes such as 4-level pulse-amplitude modulation (PAM4) or 16-level quadrature amplitude modulation (16 QAM) have been introduced. Therefore, the optical transmitter 1 is required to cope with multilevel amplitude modulation schemes such as PAM4 and 16 QAM. Through the multilevel amplitude modulation, the optical transmitter 1 can perform higher speed and larger capacitance communication, for example, than with binary amplitude modulation.

Specifically, for example, the optical transmitter 1 is used for high-speed data communication of 28 Gbps or 40 Gbps. In this case, it is necessary for the driver circuit (traveling wave amplifier) 10 to amplify electrical signals, for example, up to a high frequency band of about 20 GHz. Therefore, in the optical transmitter 1 corresponding to a multilevel amplitude modulation scheme, the driver circuit 10 is required to have sufficient frequency response. More specifically, a small degradation in a gain at a high frequency and a small reflection coefficient of an input are required. For example, in an amplification circuit (a traveling wave amplifier) 10 that is used in multilevel amplitude of 32 Gbaud, such characteristics should be provided up to about 20 GHz.

First Embodiment

Figure 2:
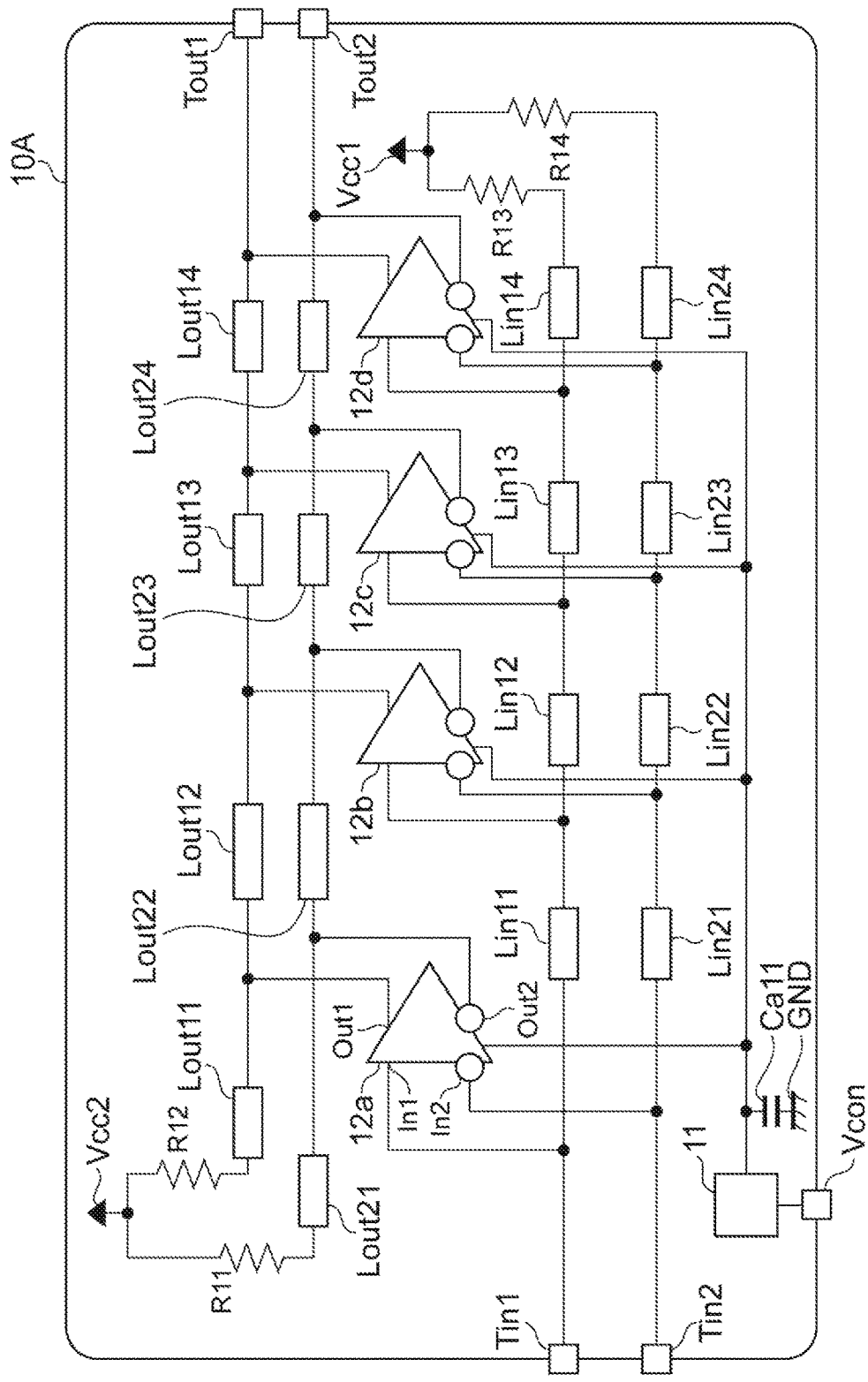
FIG. 2 is a circuit diagram of a driver circuit according to a first embodiment.

FIG. 2 is a circuit diagram illustrating a detailed configuration of a driver circuit (a traveling wave amplifier) 10A according to a first embodiment. The traveling wave amplifier 10A can be used as the driver circuit 10 (FIG. 1).

As illustrated in FIG. 2, the traveling wave amplifier 10A includes input terminals Tin1 and Tin2, input-side transmission lines (first input-side transmission lines) Lin11 to Lin14, input-side transmission lines (second input-side transmission lines) Lin21 to Lin24, amplification cells 12a to 12d, output-side transmission lines (first output-side transmission lines) Lout11 to Lout14, output-side transmission lines (second output-side transmission lines) Lout21 to Lout24, output terminals Tout1 and Tout2, termination resistors R11 to R14, a capacitor Ca11, and a voltage circuit 11 (a gain adjustment circuit). In the example illustrated in FIG. 2, the number of amplification cells is four (12a to 12d). The number of amplification cells may be an arbitrary number equal to or greater than two and is not particularly limited. For example, the number of amplification cells may be equal to or greater than five. The number of input-side transmission lines (Lin11 and the like), output-side transmission lines (Lout11 and the like), or the like disposed between the amplification cells can be appropriately changed according to the number of amplification cells.

The input terminals Tin1 and Tin2 receive signals (two complementary input signals) from the outside. The signals are amplified by the traveling wave amplifier 10A. The input terminals Tin1 and Tin2 are connected to the input-side transmission lines Lin11 and Lin21, respectively, and are input ports of the input-side transmission lines. The two complementary input signals have phases opposite to each other. That is, one of the two complementary input signals has a phase opposite to the phase of the other of the two complementary input signals. For example, when one of the two complementary input signals is a positive phase signal and the other of the two complementary input signals is a negative phase signal, the negative phase signal decreases when the positive phase signal increases and the negative phase signal increases when the positive phase signal decreases. Further, when the positive phase signal reaches a peak value, the negative phase signal reaches a bottom value, and when the positive phase signal reaches a bottom value, the negative phase signal reaches a peak value. The two complementary input signals can be treated as one differential input signal. For example, a voltage amplitude of the differential input signal corresponds to a difference between a potential of one (positive phase signal) of two complementary input signals and a potential of the other (negative phase signal) of the two complementary input signals. When the two complementary input signals are treated as the differential input signal, the amplitude of the positive phase signal is substantially the same as the amplitude of the negative phase signal, and an average potential of the positive phase signal is preferably equal to an average potential of the negative phase signal. The signal received by the input terminals Tin1 and Tin2 is, for example, a voltage signal with pulse waveform and includes, for example, frequency components up to about 20 GHz. The input terminal Tin1 is electrically connected to the input side of the amplification cells 12a to 12d (for example, the input terminal In1 serving as a positive phase input terminal (or a non-inverting input terminal of a differential amplification circuit)). This "electrically connected" means that the input terminal Tin1 and the amplification cells 12a to 12d may be directly connected to each other, or the input terminal Tin1 and the amplification cells 12a to 12d may be connected to be able to transfer an electrical signal via a transmission line such as the input-side transmission line Lin11, an electrical circuit, or the like. The input terminal Tin2 is electrically connected to the input side of the amplification cells 12a to 12d (for example, the input terminal In2 serving as a negative phase input terminal (or an inverting input terminal of the differential amplification circuit)).

The input-side transmission lines (the first input-side transmission lines) Lin11 to Lin14 and the input-side transmission lines (the second input-side transmission lines) Lin21 to Lin24 transmit the signals received by the input terminals Tin1 and Tin2. The input-side transmission line Lin11 and the like can include, for example, a coplanar line, a microstrip line, or the like. However, the type of transmission line is not particularly limited. The input-side transmission lines Lin11 to Lin14 and Lin21 to Lin24 are configured to have predetermined characteristic impedance. The characteristic impedance of the input-side transmission lines Lin11 to Lin14 may be set to the same value as the characteristic impedance of the input-side transmission lines Lin21 to Lin24. A configuration of the input-side transmission lines Lin11 to Lin14 may be configured to be identical or similar to a configuration of the input-side transmission lines Lin21 to Lin24. It should be noted that hereinafter, the input-side transmission lines Lin11 to Lin14 and Lin21 to Lin24 may be collectively referred to as "input-side transmission line Lin11 and the like". The input-side transmission lines Lin11 and Lin21 indicate transmission lines disposed between the amplification cell 12*a* and the amplification cell 12*b*. Further, the input-side transmission lines Lin12 and Lin22 indicate transmission lines disposed between the amplification cell 12*b* and the amplification cell 12*c*. Thus, each of the input-side transmission lines Lin11, Lin21, and the like indicates a transmission line between two amplification cells. However, for example, the input-side transmission lines Lin11 to Lin14 connected in cascade may be formed as a single coplanar line or microstrip line without a joint in shape. In such a case, a boundary between the input-side transmission line Lin11 and Lin12 is conveniently determined from a positional relationship between the amplification cell 12*a* and the amplification cell 12*b*.

The input terminals Tin1 and Tin2 are directly connected to the input side (for example, the positive phase input terminal and the negative phase input terminal) of the amplification cell 12*a*. It should be noted that each of the input terminals Tin1 and Tin2 may be connected to the input side of the amplification cell 12*a* via a transmission line having the same configuration as the input-side transmission line Lin11 or Lin21.

One end of the input-side transmission line Lin11 is connected to the input terminal Tin1, and the other end of the input-side transmission line Lin11 is connected to the input side (for example, a positive phase input terminal) of the amplification cell 12*b*. One end of the input-side transmission line Lin21 is connected to the input terminal Tin2, and the other end of the input-side transmission line Lin21 is connected to the input side (for example, a negative phase input terminal) of the amplification cell 12*b*.

One end of the input-side transmission line Lin12 is connected to the other end of the input-side transmission line Lin11, and the other end of the input-side transmission line Lin12 is connected to the input side (for example, a positive phase input terminal) of the amplification cell 12*c*. One end of the input-side transmission line Lin22 is connected to the other end of the input-side transmission line Lin21, and the other end of the input-side transmission line Lin22 is connected to the input side (for example, a negative phase input terminal) of the amplification cell 12*c*.

One end of the input-side transmission line Lin13 is connected to the other end of the input-side transmission line Lin12, and the other end of the input-side transmission line Lin13 is connected to the input side (for example, a positive phase input terminal) of the amplification cell 12*d*. One end of the input-side transmission line Lin23 is connected to the other end of the input-side transmission line Lin22, and the other end of the input-side transmission line Lin23 is connected to the input side (for example, a negative phase input terminal) of the amplification cell 12*d*.

One end of the input-side transmission line Lin14 is connected to the other end of the input-side transmission line Lin13, and the other end of the input-side transmission line Lin14 is connected to one end of a termination resistor R13. One end of the input-side transmission line Lin24 is connected to the other end of the input-side transmission line Lin23 and the other end of the input-side transmission line Lin24 is connected to one end of a termination resistor R14. The other ends of the termination resistors R13 and R14 are connected to a power supply line Vcc1. The power supply line Vcc1 supplies a DC input voltage to the amplification cells 12*a* to 12*d*. For example, an average voltage of each of the positive phase signal and the negative phase signal input to the amplification cell 12*a* is equal to the voltage Vcc1 supplied by the power supply line Vcc1. The power supply line Vcc1 can be regarded as being equivalent to the ground (ground potential) for an input signal at a high frequency (or high frequency components of an input signal). Although the input-side transmission lines Lin11, Lin12, Lin13, Lin14 are connected in cascade in this order, the input-side transmission lines may form one coplanar line or microstrip line, as described above.

The amplification cells 12*a* to 12*d* receive the input signals from the input terminals Tin1 and Tin2 with different delay times with reference to the time when the input signal is input to the input terminals Tin1 and Tin2. Each of the amplification cells 12*a* to 12*d* amplifies the signal input to the input side and outputs the amplified signal as an output signal. The voltage circuit 11 (a gain adjustment circuit) is connected to the amplification cells 12*a* to 12*d*. A capacitor Ca11 having a capacitance of about 10 pF, for example, is connected between a ground (GND) and a point in a wiring configured to connect the voltage circuit 11 to the amplification cells 12*a* to 12*d*. The capacitor Ca11 is disposed between the voltage circuit 11 and a closest junction to the voltage circuit 11 in the wiring. A voltage signal is input from the outside to the voltage circuit 11 via an input terminal Vcon. The voltage circuit 11 supplies a control signal Vcon1 (a gain adjustment signal) to the amplification cells 12*a* to 12*d*. The control signal Vcon1 adjusts a gain (a voltage gain) of the amplification cells 12*a* to 12*d* according to the voltage signal. Therefore, changing a voltage value of the input terminal Vcon allows the gain (the voltage gain) of the amplification cells 12*a* to 12*d* to be set to an arbitrary value. Details of the amplification cells 12*a* to 12*d* will be described below with reference to FIG. 5 and subsequent figures.

Output terminals Tout1 and Tout2 are terminals for outputting output signals (two complementary output signals) generated by the amplification cells 12*a* to 12*d* to the outside. The output terminal Tout1 is electrically connected to an output side of the amplification cells 12*a* to 12*d* (for example, an output terminal Out1 as a positive phase output terminal (or a non-inverting output terminal of a differential amplification circuit)). The output terminal Tout2 is electrically connected to the output side of the amplification cells 12*a* to 12*d* (for example, an output terminal Out2 as a negative phase output terminal (or an inverting output terminal of the differential amplification circuit)).

The output-side transmission lines (first output-side transmission lines) Lout11 to Lout14 and the output-side transmission lines (second output-side transmission lines) Lout21 to Lout24 transfer the output signals output from the amplification cells 12*a* to 12*d*. The output-side transmission lines Lou11 to Lout14 and Lout21 to Lout24 can include, for example, coplanar lines or a microstrip lines, identical or similar to the input-side transmission line Lin11 or the like. However, the type of lines is not particularly limited. The output-side transmission lines Lout11 to Lout14 and Lout21 to Lout24 are configured to have predetermined characteristic impedances. The characteristic impedances of the output-side transmission lines Lout11 to Lout14 may be set to the same values as characteristic impedances of the output-side transmission lines Lout21 to Lout24. A configuration of the output-side transmission lines Lout11 to Lout14 may be configured to be identical or similar to a configuration of the input-side transmission lines Lout21 to Lout24.

One end of the output-side transmission line Lout11 is connected to one end of a termination resistor R12, and the other end of the output-side transmission line Lou11 is connected to the output side (for example, the positive phase output terminal) of the amplification cell 12a. One end of the output-side transmission line Lout21 is connected to one end of a termination resistor R11, and the other end of the output-side transmission line Lout21 is connected to the output side (for example, the negative-phase output terminal) of the amplification cell 12a. The other ends of the termination resistors R11 and R12 are connected to a power supply line Vcc2. The power supply line Vcc2 supplies a power supply voltage Vcc2 to the amplification cells 12a to 12d. The power supply line Vcc2 can be regarded as being equivalent to a ground (ground potential) with respect to a high frequency output signal (or high frequency components of the output signal).

One end of the output-side transmission line Lout12 is connected to the output side (for example, the positive phase output terminal) of the amplification cell 12a, and the other end of the output-side transmission line Lout12 is connected to one end of the output-side transmission line Lout13. One end of the output-side transmission line Lout22 is connected to the output side (for example, the negative phase output terminal) of the amplification cell 12a, and the other end of the output-side transmission line Lout22 is connected to one end of the output-side transmission line Lout23.

One end of the output-side transmission line Lout13 is connected to the output side (for example, the positive phase output terminal) of the amplification cell 12b, and the other end of the output-side transmission line Lout13 is connected to one end of the output-side transmission line Lout14. One end of the output-side transmission line Lout23 is connected to the output side (for example, the negative phase output terminal) of the amplification cell 12b, and the other end of the output-side transmission line Lout23 is connected to one end of the output-side transmission line Lout24.

One end of the output-side transmission line Lout14 is connected to the output side (for example, the positive-phase output terminal) of the amplification cell 12c, and the other end of the output-side transmission line Lout14 is connected to the output terminal Tout1. One end of the output-side transmission line Lout24 is connected to the output side (for example, the negative phase output terminal) of the amplification cell 12c, and the other end of the output-side transmission line Lout24 is connected to the output terminal Tout2. The output terminals Tout1 and Tout2 are directly connected to the output side (for example, the positive phase output terminal and the negative phase output terminal) of the amplification cell 12d. It should be noted that each of the output terminals Tout1 and Tout2 may be connected to the output side of the amplification cell 12d via a transmission line having the same configuration as the output-side transmission lines Lou11 or Lout21.

Figure 3A:
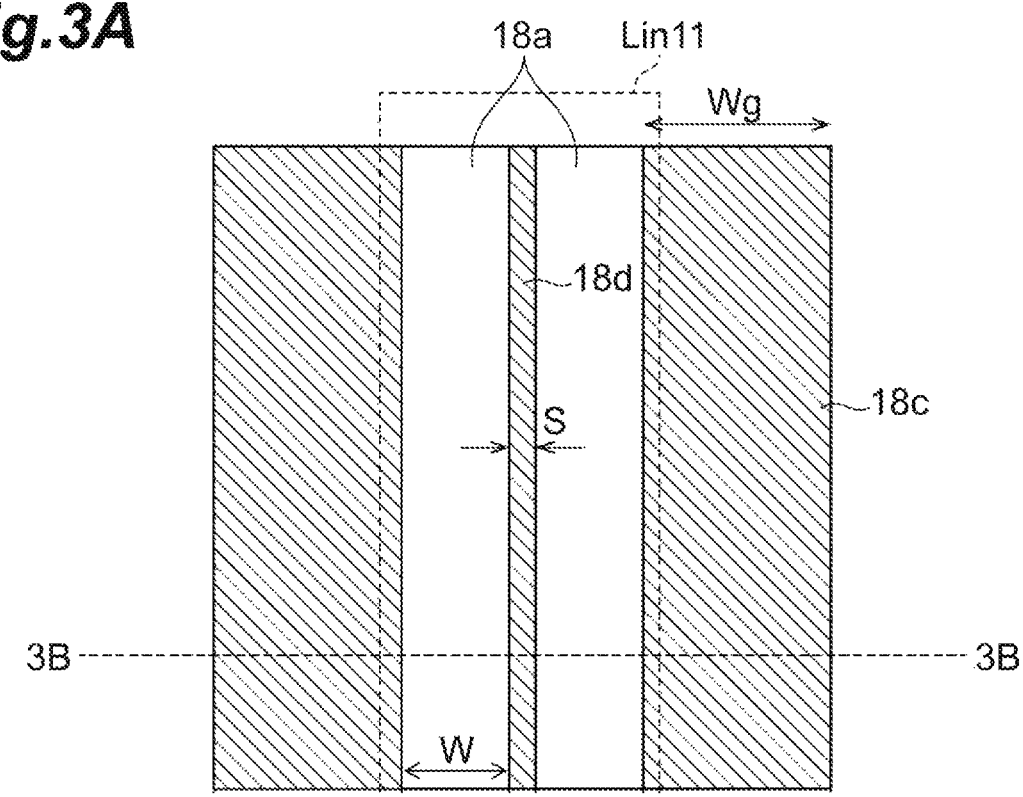
FIG. 3A is a plan view illustrating an example of a configuration of an input-side transmission line Lin11 in FIG. 2.
Figure 3B:
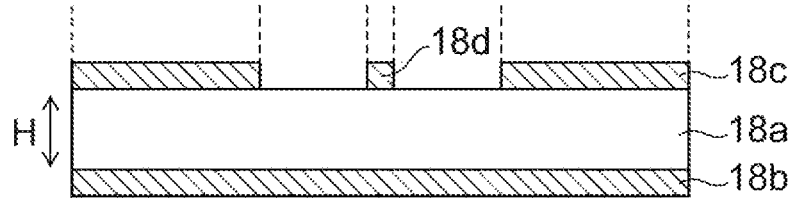
FIG. 3B is a cross-sectional view illustrating an example of the configuration of the input-side transmission line Lin11 in FIG. 2.

Here, FIG. 3A is a plan view illustrating an example of a configuration of the input-side transmission line Lin11. FIG. 3B is a cross-sectional view of the input-side transmission line Lin11 for a broken line 3B in FIG. 3A. As illustrated in these figures, the input-side transmission line Lin11 includes a substrate 18a, a lower metal film 18b, an upper metal film 18c, and a wiring 18d. The substrate 18a is formed of an insulator such as silicon oxide or a BCB film, or a semiconductor substrate such as InP, GaAs, or Si. The lower metal film 18b is formed to cover one surface (lower surface) of the substrate 18a. The upper metal film 18c is formed to cover the other surface (upper surface) of the substrate 18a excluding a band-like region (exposed portion). The wiring 18d is formed in a straight line at a center of the exposed surface (the exposed portion) on the other surface of the substrate 18a. The wiring 18d extends parallel to an extending direction of the exposed portion. The metal films 18b and 18c are wirings or pattern for ground connection (ground wirings), and the wiring 18d is a wiring for connection to a wiring on the input terminal Tin1 side. The metal film 18c and the wiring 18d are formed to be adjacent to each other with a distance W therebetween on the other surface (upper surface) of the substrate 18a. With the input-side transmission line Lin11 having such a configuration, the characteristic impedance of the transmission line and a delay time in the transmission line can be adjusted by adjusting a thickness H of the substrate 18a, a width S of the wiring 18d, or a distance W between the upper metal film 18c and the wiring 18d. For example, when the width S=3 μm, the distance W=10 μm, the thickness H=100 μm, and a relative permittivity ε of the substrate 18a=12.8, the characteristic impedance is set to 78Ω, and the delay time per unit length is set to 8.76 ps/mm. The same structures can be adopted for the input-side transmission lines Lin12 to Lin14 and Lin21 to Lin24 and the output-side transmission lines Lou11 to Lout14 and Lout21 to Lout24. It should be noted that the configuration and the characteristic impedances shown herein are mere examples and do not limit the embodiments of the present invention.

Figure 4:
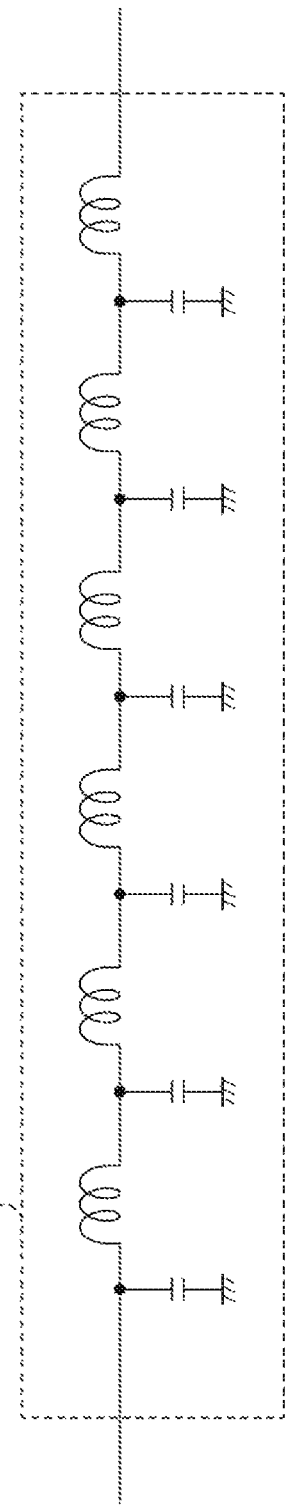
FIG. 4 is an equivalent circuit diagram of the input-side transmission lines Lin11 to Lin14 in FIG. 2.

Further, FIG. 4 illustrates an equivalent circuit of the input-side transmission lines Lin11 to Lin14 having the above-described configuration. Thus, the input-side transmission lines Lin11 to Lin14 are represented as distributed constant lines of inductive components and capacitive components. Each inductive component corresponds to an inductance of the wiring 18d in FIG. 3A. Each capacitive component corresponds to a sum of a capacitance of the wiring 18d in FIG. 3A and an input capacitance (about 20 to 200 fF) of the input terminal In1 of each of the amplification cells 12a to 12d. That is, in FIG. 4, capacitive components of the individual wirings of the input-side transmission lines Lin11 to Lin14 and individual input capacitances of the amplification cells 12a to 12d are summed up and represented by one capacitor. Similarly, the input-side transmission lines Lin21 to Lin24 are indicated as distributed constant lines of an inductive component and a capacitive component. Each inductive component corresponds to the inductance of the wiring 18d in FIG. 3A. Each capacitive component corresponds to a sum of the capacitance of the wiring 18d in FIG. 3A and an input capacitance (about 20 to 200 fF) of the input terminal In2 of the amplification cells 12a to 12d. Similarly, the output-side transmission lines Lout11 to Lout14 and Lout21 to 24 constitute a delay transmission line (a distributed constant circuit) formed of inductive components and capacitive components of the wirings and an output capacitance (about 20 fF) of the output terminals Out1 and Out2 of the amplification cells 12a to 12d.

In the traveling wave amplifier 10A described above, the two complementary input signals (which can be treated as one differential input signal as described above) input from the input terminals Tin1 and Tin2 are amplified by the respective amplification cells 12a to 12d and output to the output terminals Tout1 and Tout2 as two complementary output signals (which can be treated as one differential output signal as described above). The traveling wave amplifier 10A is designed such that a phase difference between the two complementary input signals at the input terminals Tin1 and Tin2 matches a phase difference of the two complementary output signals at the output terminals Tout1 and Tout2. Specifically, the traveling wave amplifier 10A is designed so that delay times until the output signal changes according to a change in the input signal in the respective amplification cells 12a to 12d are equal to each other and is designed so that delay times of corresponding portions between the input-side transmission lines and the output-side transmission lines are equal to each other. More specifically, the delay times of the input-side transmission lines Lin11 and Lin21 are made equal to the delay times of the output-side transmission lines Lout12 and Lout22. The delay times of the input-side transmission lines Lin12 and Lin22 are made equal to the delay times of the output-side transmission lines Lout13 and Lout23. The delay times of the input-side transmission lines Lin13 and Lin23 are made equal to the delay times of the output-side transmission lines Lout14 and Lout24. With such a design, the signals amplified through the respective amplification cells 12a to 12d are superimposed on each other in a state in which phases thereof are aligned at the output terminals Tout1 and Tout2. Here, the state in which the phases are aligned means, for example, that a transition from level 0 to level 1 of a signal (a positive phase output signal) output from the amplification cell 12a, a transition from level 0 to level 1 of a signal (a positive phase output signal) output from the amplification cell 12b, a transition from level 0 to level 1 of a signal (a positive phase output signal) output from the amplification cell 12c, and a transition from level 0 to level 1 of a signal (a positive phase output signal) output from the amplification cell 12d all occur at substantially the same time at the output terminals Tout1 and Tout2.

Next, an operation of the traveling wave amplifier 10A illustrated in FIG. 2 will be described. In an aspect, a signal input from the outside is, for example, a differential signal (a differential input signal), and a driver circuit 10A can be a traveling wave type differential amplifier. In this case, for example, a positive phase input signal (a positive phase component of the differential input signal) is input to the input terminal Tin1, and a negative phase input signal having a phase opposite to the phase of the positive phase input signal (a negative phase component of the differential input signal) is input to the input terminal Tin2. For example, when a transition from level 0 to level 1 occurs in the positive phase input signal input to the input terminal Tin1, a transition from level 1 to level 0 occurs in the negative phase input signal input to the input terminal Tin2. Thus, the positive phase input signal and the negative phase input signal change complementarily with respect to each other. Therefore, the input signal of the amplification cell 12A (FIG. 5) is a differential signal including two complementary input signals of which the phases are opposite to each other. A voltage amplitude of the differential signal corresponds to a difference between a voltage value of the positive phase input signal and a voltage value of the negative phase input signal.

The signals input from the outside to the input terminals Tin1 and Tin2 pass through different paths via the input-side transmission line Lin11 or the like and reach (are transferred to) the amplification cells 12a to 12d with different delay times (phases). The delay times can be adjusted, for example, by changing an electrical length of the input-side transmission line Lin11 or the like. It should be noted that signal components not input to any of the amplification cells 12a to 12d in the signals are terminated by the termination resistors R13 and R14.

The input signals of the amplification cells 12a to 12d are amplified by the amplification cells 12a to 12d and become output signals, respectively. The output signals pass through different paths via the output-side transmission line Lou11 or the like and reach (are transferred to) the output terminals Tout1 and Tout2 with different delay times. Since the amplification cells 12a to 12d receive and amplify the input signals (differential input signal) with different phases, the output signals (differential output signal) of the amplification cells 12a to 12d also have phases different from each other. Therefore, when the respective output signals from the amplification cells 12a to 12d reach the output terminals Tout1 and Tout2, the delay times are adjusted so that the phases of the respective output signals are aligned at the output terminals Tout1 and Tout2. The delay times can be adjusted, for example, by changing an electrical length of the output-side transmission line Lou11 or the like.

With the above operation, the traveling wave amplifier 10A can amplify the signals (one differential input signal) input to the input terminals Tin1 and Tin2, and output two signals having phases opposite to each other (the complementary output signal), that is, one differential output signal including the two signals from the output terminals Tout1 and Tout2.

Figure 5:
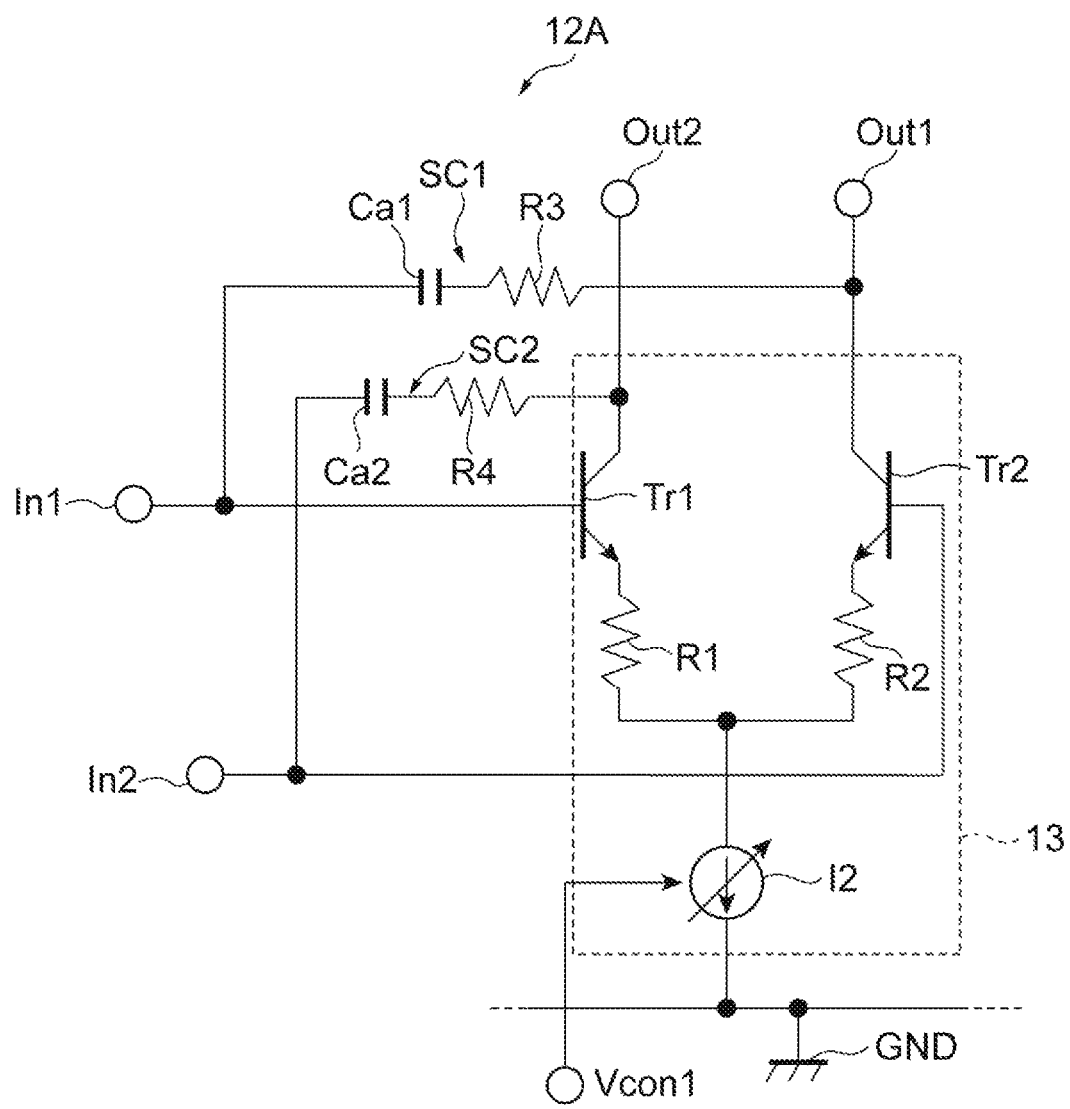
FIG. 5 is a circuit diagram illustrating an example of a configuration of an amplification cell in FIG. 2.

Next, a circuit configuration of the amplification cells 12a to 12d will be described with reference to FIG. 5. FIG. 5 is a diagram illustrating an example of the configuration of the amplification cells. In the embodiment, the differential amplification cell 12A is adopted.

As illustrated in FIG. 5, the amplification cell 12A is a differential amplifier that amplifies the differential signal input from an input unit including input terminals In1, In2. The amplification cell 12A outputs the amplified differential signal as a differential signal (a differential output signal). Specifically, the amplification cell 12A includes input terminals In1 and In2, series circuits SC1 and SC2, an amplification circuit portion 13, and output terminals Out1 and Out2.

The input terminal In1 (a first input terminal) is a terminal for receiving, for example, a positive phase input signal (a positive phase component of the differential input signal), and the input terminal In2 (a second input terminal) is a terminal for receiving, for example, a negative phase input signal (a negative phase component of the differential input signal).

The amplification circuit portion 13 includes a transistor (a first transistor) Tr1, a transistor (a second transistor) Tr2, a resistor (a first resistive element) R1, a resistor (a second resistive element) R2, and a current source I2. The amplification circuit portion 13 functions as a differential amplification circuit that amplifies the input differential signal (the differential input signal) and outputs the amplified differential signal (the differential output signal). It should be noted that the resistor R1 and the resistor R2 may be necessary for the amplification cell 12A to perform a linear amplification and can be omitted when the linear amplification is unnecessary. Each of the transistors Tr1 and Tr2 has a control terminal, a first current terminal, and a second current terminal. A magnitude of a current flowing through the first current terminal and the second current terminal changes according to a signal applied to the control terminal. For example, the transistors Tr1 and Tr2 may be NPN bipolar transistors, the control terminal may be a base, the first current terminal may be an emitter, and the second current terminal may be a collector. The transistors Tr1 and Tr2 may be n-type field effect transistors (FETs), the control terminal may be a gate, the first current terminal may be a source, and the second current terminal may be a drain. Further, the transistors Tr1 and Tr2 may be formed of not only a silicon semiconductor but also a compound semiconductor such as SiGe or InP.

The base terminal (the control terminal) of the transistor Tr1 is connected to the input terminal In1 and connected to the input-side transmission lines Lin11 to Lin14 via the input terminal In1. The input capacitance of the input terminal In1 is substantially equal to an input capacitance of the base terminal of the transistor Tr1. The emitter terminal (the first current terminal) of the transistor Tr1 is connected to one end of the resistor R1. The other end of the resistor R1 is connected to the current source I2. The current source I2 is connected between the resistor R1 and the ground (GND) to supply a current from the emitter terminal of the transistor Tr1 to the ground via the resistor R1. That is, the current source I2 is connected to the emitter terminal (the first current terminal) of the transistor Tr1 via the resistor R1. A ratio of the current flowing from the emitter terminal of the transistor Tr1 to the current source I2 to the current supplied by the current source I2 changes according to a voltage value applied to the input terminal In1. Further, the current source I2 is configured such that a current value thereof can be adjusted by the voltage circuit 11 according to the control signal Vcon received from the outside.

The base terminal (the control terminal) of the transistor Tr2 is connected to the input terminal In2 and is connected to the input-side transmission lines Lin21 to Lin24 via the input terminal In2. The input capacitance of the input terminal In2 is substantially equal to an input capacitance of the base terminal of the transistor Tr2. The emitter terminal (the first current terminal) of the transistor Tr2 is connected to one end of the resistor R2. The other end of the resistor R2 is connected to the current source I2. The current source I2 is also connected between the resistor R2 and the ground (GND) to supply a current from the emitter terminal of the transistor Tr2 to the ground via the resistor R2. That is, the current source I2 is also connected to the emitter terminal (the first current terminal) of the transistor Tr2 via the resistor R2. A ratio of a current flowing from the emitter terminal of the transistor Tr2 to the current source I2 to the current supplied by the current source I2 changes according to a voltage value applied to the input terminal In2.

Incidentally, the emitter current of the transistor Tr1 flows into the current source I2 via the resistor R1, and the emitter current of the transistor Tr2 flows into the current source I2 via the resistor R2. Therefore, the current supplied by the current source I2 is equal to a sum of the emitter current of the transistor Tr1 and the emitter current of the transistor Tr2. Therefore, when the current supplied by the current source I2 is constant, the emitter current of the transistor Tr1 and the emitter current of the transistor Tr2 have a complementary relationship in which when one of the emitter currents increases, the other decreases, whereas when one decreases, the other increases. In this case, the emitter current of the transistor Tr1 and the emitter current of the transistor Tr2 change according to a difference between a voltage input to the base terminal of the transistor Tr1 (a base voltage) and a voltage input to the base terminal of the transistor Tr2 (a base voltage). For example, when the base voltage of the transistor Tr1 is higher than the base voltage of the transistor Tr2, the emitter current of the transistor Tr1 becomes larger than the emitter current of the transistor Tr2, and when the base voltage of the transistor Tr1 is lower than the base voltage of the transistor Tr2, the emitter current of the transistor Tr1 becomes smaller than the emitter current of the transistor Tr2. Also, when the base voltage of the transistor Tr1 is substantially equal to the base voltage of the transistor Tr2, the emitter current of the transistor Tr1 becomes substantially equal to the emitter current of the transistor Tr2. That is, in this state, respective halves of the current supplied by the current source I2 become the emitter current of the transistor Tr1 and the emitter current of the transistor Tr2, respectively. Thus, currents output from the output terminals Out1 and Out2 complementarily change according to the difference between the base voltage of the transistor Tr1 and the base voltage of the transistor Tr2.

The output terminal Out1 is a terminal that outputs the positive phase output signal (the positive phase component of the differential output signal) which is one of complementary output signals. The output terminal Out1 is connected to the collector terminal (the second current terminal) of the transistor Tr2. The output terminal Out2 is a terminal that outputs a negative phase output signal (a negative phase component of the differential output signal) which is the other of the complementary output signals. The output terminal Out2 is connected to the collector terminal (the second current terminal) of the transistor Tr1. That is, the collector terminal of the transistor Tr2 is connected to the output-side transmission lines Lout11 to Lout14 via the output terminal Out1, and the collector terminal of the transistor Tr1 is connected to the output-side transmission lines Lout21 to Lout24 via the output terminal Out2. An output capacitance of the output terminal Out1 is substantially equal to an output capacitance of the collector terminal of the transistor Tr2. An output capacitance of the output terminal Out2 is substantially equal to an output capacitance of the collector terminal of the transistor Tr1.

The series circuit (a first series circuit) SC1 is a circuit that is connected between the base terminal of the transistor Tr1 and the collector terminal of the transistor Tr2 and serves to positively feed back a signal generated at the output terminal Out1 to the input terminal In1. The series circuit SC1 is a circuit in which a capacitor (first capacitor) Ca1 and a resistor (a first feedback resistance element) R3 are connected in series, one end of the series circuit is connected to the collector terminal of the transistor Tr2, and the other end is connected to the input terminal In1. The capacitor Ca1 is a capacitor for positive feedback, and the resistor R3 is a damping resistor for preventing a positive feedback from making an amplification operation of the amplification circuit portion 13 unstable (for example, an oscillation phenomenon). The series circuit (a second series circuit) SC2 is a circuit that is connected between the base terminal of the transistor Tr2 and the collector terminal of the transistor Tr1 and serves to positively feed back the signal generated at the output terminal Out2 to the input terminal In2. The series circuit SC2 is a circuit in which a capacitor (a second capacitor) Ca2 and a resistor (a second feedback resistance element) R4 are connected in series, one end of the series circuit is connected to the collector terminal of the transistor Tr1, and the other end is connected to the input terminal In2. The capacitor Ca2 is a capacitor for positive feedback, and the resistor R4 is a damping resistor for preventing the positive feedback from making an amplification operation of the amplification circuit portion 13 unstable. Capacitance values of the capacitors Ca1 and Ca2 are, for example, 20 fF, and resistance values of the resistors R3 and R4 are, for example, 50Ω. In the series circuit SC1, the capacitor Ca1 and the resistor R3 may be interchanged with each other. Similarly, in the series circuit SC2, the capacitor Ca2 and the resistor R4 may be interchanged with each other. Further, the series circuits SC1 and SC2 are not limited to the configuration illustrated in FIG. 5, and may be, for example, a series circuit in which a capacitor is inserted between two resistors. The capacitors Ca1 and Ca2 may be formed, for example, in a metal-insulator-metal (MIM) structure.

Next, an operation of the amplification cell 12A illustrated in FIG. 5 will be described. For example, when the amplification cell 12A is used as any of the amplification cells 12$a$ to 12$d$ (FIG. 2), the positive phase input signal from the input-side transmission line Lin11 or the like (FIG. 2) is input to the input terminal In1. The negative phase input signal from the input-side transmission line Lin21 or the like (FIG. 2) is input to the input terminal In2.

The transistors Tr1 and Tr2 are driven by the complementary input signals from the input terminals In1 and In2, and the differential input signal is amplified by the transistors Tr1 and Tr2. The amplified differential input signal is output to the output terminals Out1 and Out2 as a differential output signal. That is, for example, when the voltage of the positive phase input signal is higher than the voltage of the negative phase input signal, the transistor Tr2 is turned off, the transistor Tr1 is turned on, and a current flows from the output-side transmission lines Lout21 to Lout24 that are delay transmission lines having, for example, a characteristic impedance of 50Ω to the current source I2 via the resistor R1. Also, when the voltage of the positive phase input signal is lower than the voltage of the negative phase input signal, the transistor Tr1 is turned off, and the transistor Tr2 is turned on, and a current flows from the output-side transmission lines Lou11 to Lout14 that are delay transmission lines having, for example, a characteristic impedance of 50Ω to the current source I2 via the resistor R2. As a result, a negative phase output signal having a phase opposite to that of the positive phase input signal is generated at the output terminal Out2, and a positive phase output signal having a phase opposite to that of the negative phase input signal is generated at the output terminal Out1. The differential input signal corresponds to a difference in voltage between the positive phase input signal and the negative phase input signal, and the differential output signal corresponds to a difference in voltage between the positive phase output signal and the negative phase output signal. A differential voltage gain of the amplification circuit portion 13 can be defined as a ratio of the voltage amplitude of the differential output signal to the voltage amplitude of the differential input signal.

It should be noted that an operation state of the differential amplification circuit in which one transistor is turned off and the other transistor is turned on as described above is referred to as a saturation operation. Setting the resistor R1 and the resistor R2 to have appropriate resistances allows the amplification circuit portion 13 to operate in a state of non-saturation operation with respect to the differential input signal (a non-saturated state). In a case in which a linear amplification operation is necessary for the differential input signal, a non-saturation operation is set to be performed.

With the above operation, the amplification cell 12A can amplify the differential signal (differential input signal) input to the input terminals In1 and In2 and output the amplified differential signal (differential output signal) to the output terminals Out1 and Out2.

Next, an operation and effects due to adopting the amplification cell 12A in the first embodiment will be described through comparison with a comparative example.

Figure 12:
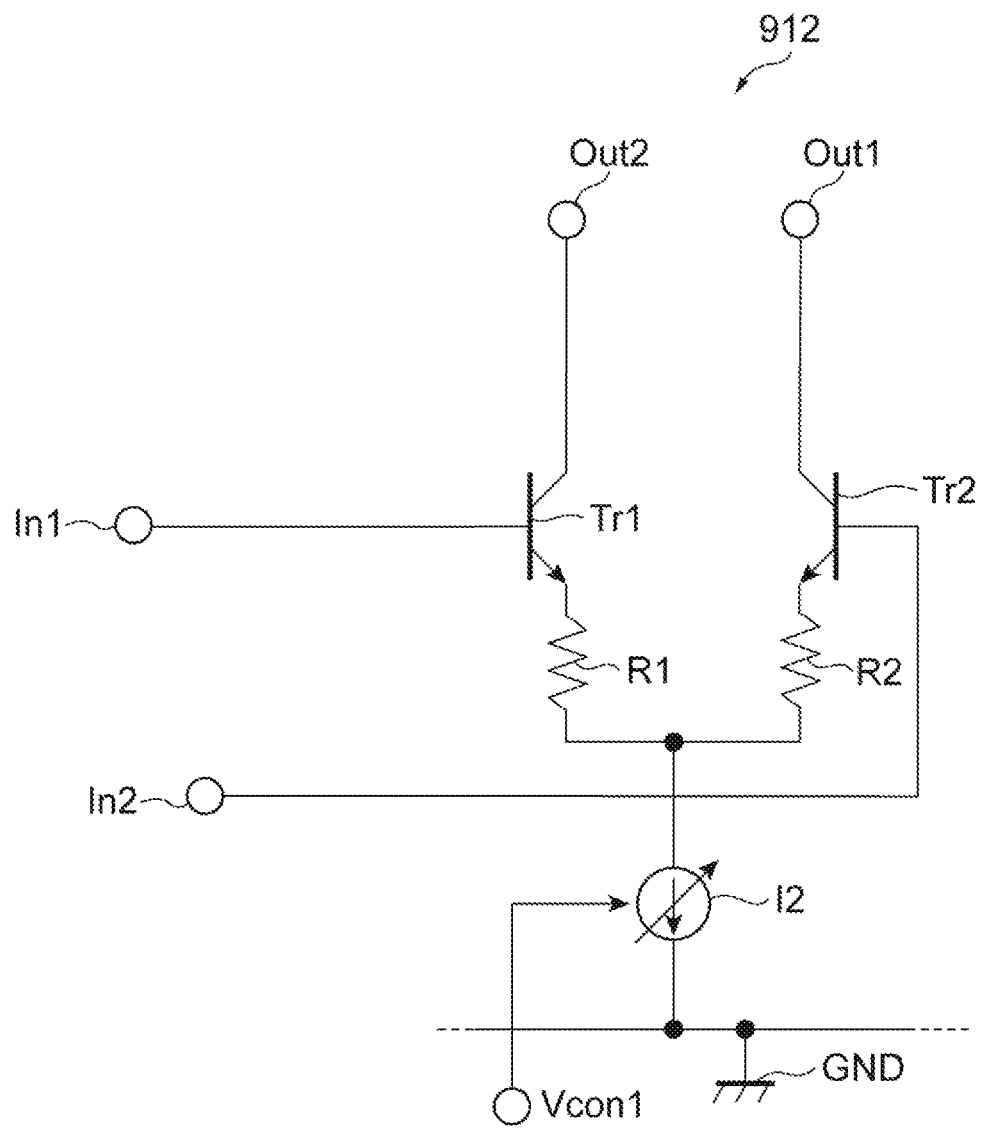
FIG. 12 is a circuit diagram illustrating a configuration of an amplification cell according to a comparative example.

FIG. 12 is a diagram illustrating a configuration of an amplification cell 912 according to a comparative example. The amplification cell 912 of this comparative example is different from the amplification cell 12A of the embodiment in that the amplification cell 912 does not include the series circuits SC1 and SC2.

Figure 13:
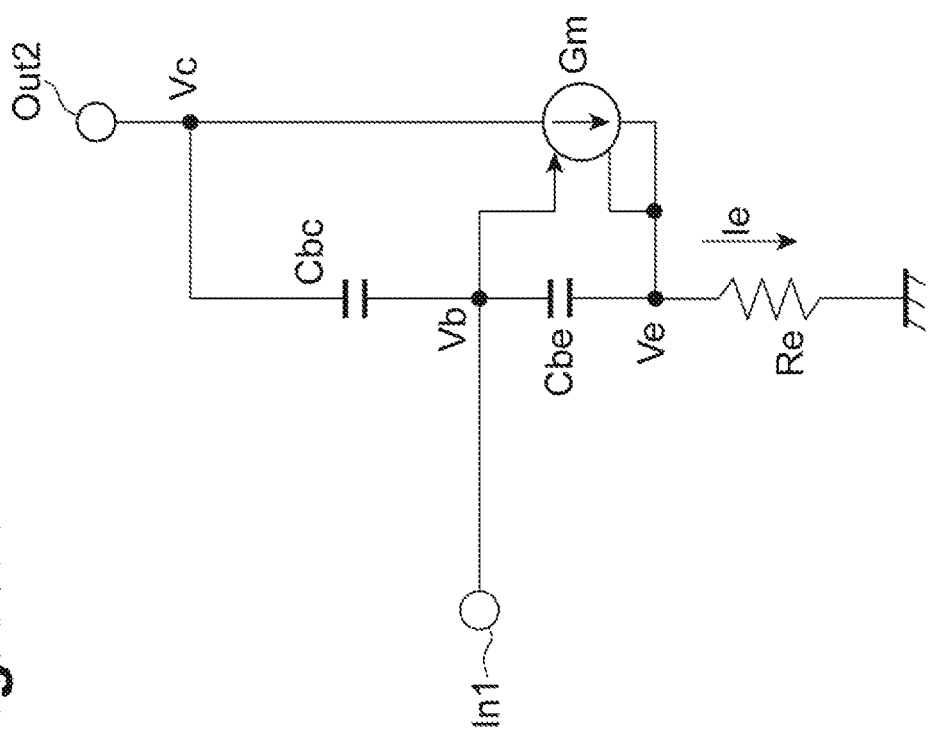
FIG. 13A is an equivalent circuit diagram viewed from the input terminal side of the amplification cell in FIG. 12.
FIG. 13B is an equivalent circuit diagram viewed from the input terminal side of the amplification cell in FIG. 12.

FIG. 13A illustrates an equivalent circuit when viewed from the input terminal In1 of the amplification cell 912. Here, since a circuit configuration of the amplification cell 912 has symmetry with respect to the two input terminals In1 and In2, an equivalent circuit for a single-ended circuit regarding one input terminal is illustrated. FIG. 13B illustrates only capacitive components in the equivalent circuit in FIG. 13A. As illustrated in FIG. 13A, a single-ended equivalent circuit of the amplification cell 912 includes a base-emitter capacitance Cbe, a base-collector capacitance Cbc, a voltage-current gain Gm, and an emitter-side resistance Re of the transistor Tr1. In these figures, Vb is a base voltage of the transistor Tr1, Vc is a collector voltage of the transistor Tr1, Ve is an emitter voltage of the transistor Tr1, and Ie is an emitter current of the transistor Tr1. Here, the emitter-side resistance Re includes an emitter resistance of the transistor Tr1 itself and a resistance value of the externally connected resistor R1. A voltage gain $Ac=\Delta Vc/\Delta Vb$ of a collector potential from a base potential in the transistor Tr1 depends on a set value of the voltage gain of the entire traveling wave amplifier, but is usually about −3.0 (this negative value of the voltage gain is caused by the fact that an operation of the transistor Tr1 acts as in an inverting amplification circuit in which an output signal decreases with an increase in an input signal). Therefore, the value of the collector voltage Vc when the base voltage Vb is applied to the base terminal is expressed by the following equation:

$$Vc = Ac \times Vb,$$

and the base-collector voltage Vbc applied to both ends of the capacitor Cbc is expressed by the following equation:

$$Vbc = Vb - Vc = Vb - Ac \times Vb = Vb \times (1 - Ac).$$

Therefore, the value of the capacitance Cbc when viewed from the base is equivalently expressed as $Cbc \times (1-Ac)$. Further, a voltage gain $Ae=\Delta Ve/\Delta Vb$ of an emitter potential from the base potential in the transistor Tr1 depends on the resistance Re, but is usually about 0.5 to 0.8. Similarly, the value of the capacitance Cbe viewed from the base is equivalently expressed as $Cbe \times (1-Ae)$. Accordingly, when only the input capacity is extracted from the equivalent circuit in FIG. 13A, a form in which a capacitor having the capacitance value $Cbc \times (1-Ac)$ and a capacitor having the capacitance value $Cbe \times (1-Ae)$ are connected in parallel between the input terminal In1 and the ground is obtained, as illustrated in FIG. 13B. For example, when Cbe=150 fF, Ae=0.6, Cbc=5 fF, and Ac=−3.0, the input capacitance Cin of the amplification cell 912 is calculated as Cin=80 fF. On the other hand, the output capacitance Cout of the amplification cell 912 is Cout=Cbc=5 fF.

Figure 14:
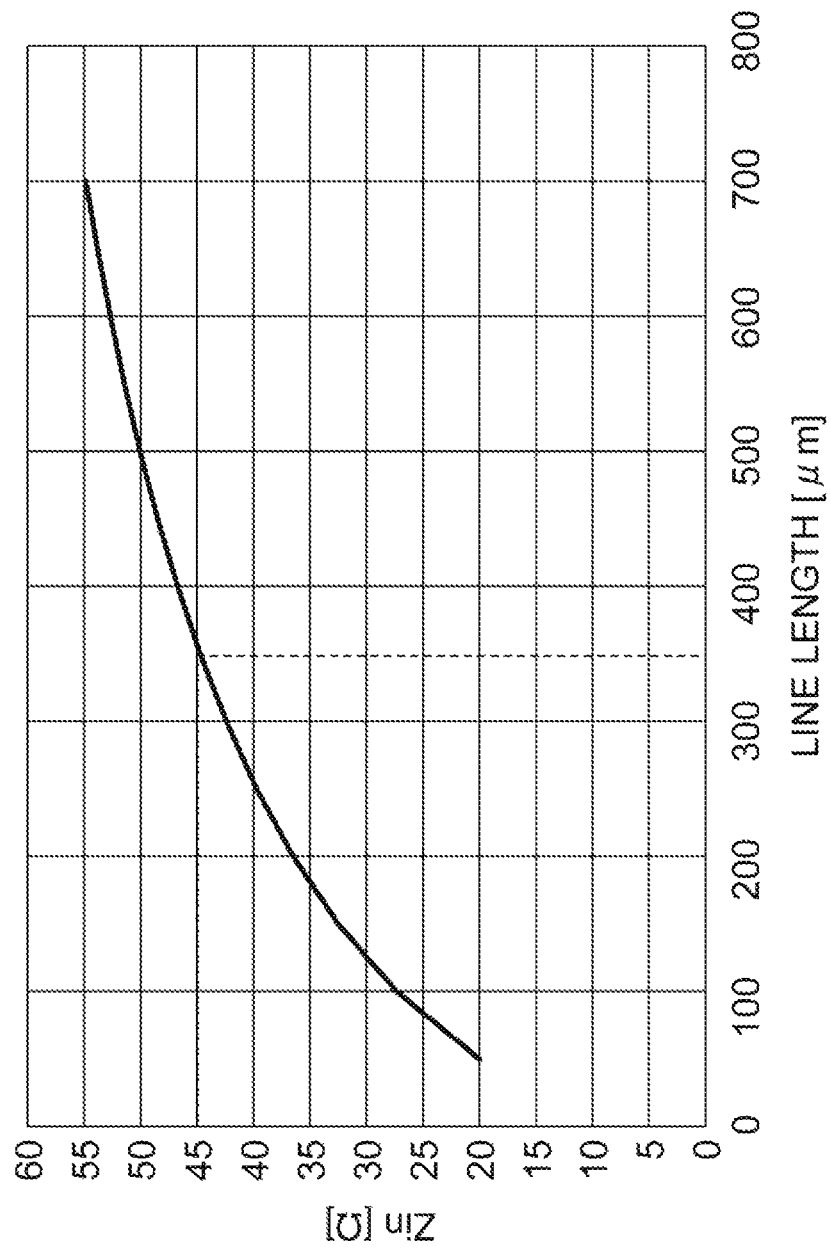
FIG. 14 is a graph illustrating a relationship between a line length of an input-side transmission line per cell and an input impedance in a case in which the amplification cell in FIG. 12 is built into a driver circuit having the same configuration as that in FIG. 2.

Here, a line length of a transmission line in a case in which the amplification cell 912 of the comparative example is built into the traveling wave amplifier having the same configuration as in FIG. 2 is considered. FIG. 14 illustrates a relationship between a line length of the input-side transmission line per cell and the input impedance Zin when the amplification cell 912 of the comparative example is built into a traveling wave amplifier having the same configuration as in FIG. 2. This relationship is derived from the fact that a relationship between a capacitive component C and an inductive component L constituting the input-side transmission line, and the characteristic impedance Z and a delay time Td of the input-side transmission line is expressed by $$Z = (L/C)^{1/2}, \quad Td = (L \cdot C)^{1/2}.$$

It should be noted that this capacitive component C has a value obtained by adding the input capacitance Cin of the amplification cell to the capacitive component of the line itself as described above. From this relationship, for example, when Zin is desired to be set to at least 45Ω or more for the purpose of matching the input impedance of the traveling wave amplifier to 50Ω, a line length of the input-side transmission line of about 350 μm is required. Therefore, for example, in a traveling wave amplifier with six cells, since a transmission line having a length corresponding to six amplification cells is formed in a direction of transmission of a signal, a line length of the input-side transmission line of 2.1 mm is required. The line length of the input-side transmission line can be shortened by increasing the voltage gain Ae (increasing the value of the resistance Re in FIG. 13A) or decreasing the voltage gain Ac to reduce the input capacitance Cin of the amplification cell 912. However, in this case, the gain of the traveling wave amplifier is decreased, such that the gain required for the driver circuit cannot be sufficient. Also, since it is necessary to match the delay time of the output-side transmission line with that of the input-side transmission line, the same length as the line length of the input-side transmission line is required. It should be noted that, in this case, it is possible to form the output-side transmission line to have a predetermined characteristic impedance (for example, 50Ω) by changing the shape (for example, a width S, a distance W, or a width Wg) of the output-side transmission line into a shape different from that of the input-side transmission line according to the output capacitance of the amplification cell 912.

A layout area of the transmission line in the traveling wave amplifier with six cells having a line length estimated as described above may be estimated. In the configuration illustrated in FIGS. 3A and 3B, when a width S=3 μm, a distance W=10 μm, a thickness H=100 μm, and a width Wg of the upper metal film 18c is twice the width S of the wiring 18d, a total of four transmission lines having a line width of 35 μm and a line length of 2.1 mm, two on the input side and two on the output side, are required. Accordingly, a total layout area of the transmission line is 0.294 [mm$^2$]. For example, a size of one HBT element is 7 μm×3 μm, and a circuit area of six cells each having three transistors including the transistors Tr1 and Tr2 and the transistor constituting the current source I2 is 0.0004 [mm$^2$]. Therefore, the transmission line occupies most of the layout of the entire circuit, and the size of the transmission line determines an area of the driver circuit. Further, from the viewpoint of a cost and a mounting area, it is desirable for the size of the driver circuit to be set in, for example, a size of 1.0 mm×0.8 mm, and it is desirable for the size of the driver circuit to be set in a size of 0.24 [mm$^2$] when a width for a wire bonding pad (for example, 200 μm on one side) is excluded. In the traveling wave amplifier incorporating the amplification cell 912 of the comparative example, a layout area of the line is not set in the size of the driver circuit.

Figure 6:
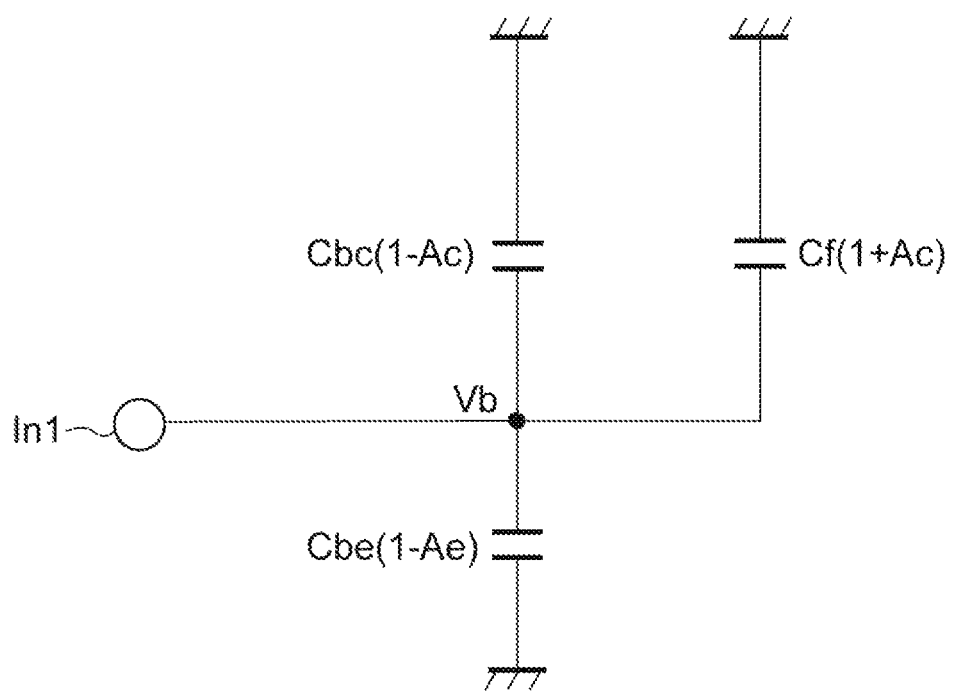
FIG. 6 is an equivalent circuit diagram of an input capacitance of the amplification cell in FIG. 5.

Incidentally, FIG. 6 illustrates an equivalent circuit of a capacitive component when viewed from the input terminal In1 side of the amplification cell 12A of the embodiment. Here, since a circuit configuration of the amplification cell 12A illustrated in FIG. 5 has symmetry with respect to the input terminals In1 and In2, an equivalent circuit for a single-ended circuit is shown (here, for the symmetry of the circuit, it may be considered that, when the signals input to the two input terminals are interchanged with each other, the signal output from the circuit exhibits substantially the same electrical characteristics as in a case in which two signals are not interchanged with each other), as in FIG. 13B. Thus, in the amplification cell 12A, a capacitive component due to the capacitor Ca1 having the capacitance value Cf included in the series circuit SC1 appears when viewed from the base of the transistor Tr1, unlike the amplification cell 912. It should be noted that the resistor R3 included in the series circuit SC1 shows a damping effect of the capacitive component at a high frequency (20 GHz or more), but an influence thereof can be neglected at a frequency of 20 GHz or less. A capacitance value viewed from the base of the transistor Tr1 is Cf×(1+Ac). For example, when Cf=20 fF and Ac=−3.0, Cf×(1+Ac)=−40 fF is calculated and the input capacitance Cin of the amplification cell 12A is reduced to Cin=40 fF. On the other hand, the output capacitance Cout of the amplification cell 12A increases to Cout=Cbc+Cf=25 fF, but since the delay time of the line is determined in the input-side transmission line having a large capacitance, an influence of an increase in output capacitance on the delay time of the line is negligible. More specifically, the output capacitance of the amplification cell 12A is smaller than the input capacitance of the output cell 12A, and accordingly, even when the length of the output-side transmission line matches the length of the input-side transmission line, it is possible to form the output-side transmission line to have the same delay time as that of the input-side transmission line (for example, a ground capacitive component of the output-side transmission line may be increased) by changing the shape (for example, a width S, a distance W, or a width Wg) of the output-side transmission line into a shape different from that of the input-side transmission line. Further, for the characteristic impedance, it is possible to similarly form the output-side transmission line to have a desired value. That is, when the input capacitance of the amplification cell 12A is larger than the output capacitance, the length of the input-side transmission line becomes a restraining factor in a case in which the length of the traveling wave amplifier 10A is shortened, and it is possible to shorten the length of the input-side transmission line by reducing the input capacitance of the amplification cell. It is possible to form the output-side transmission line to have a predetermined delay time and characteristic impedance with the same length as that of the input-side transmission line by appropriately changing the shape of the transmission line according to the output capacitance of the amplification cell.

Figure 7:
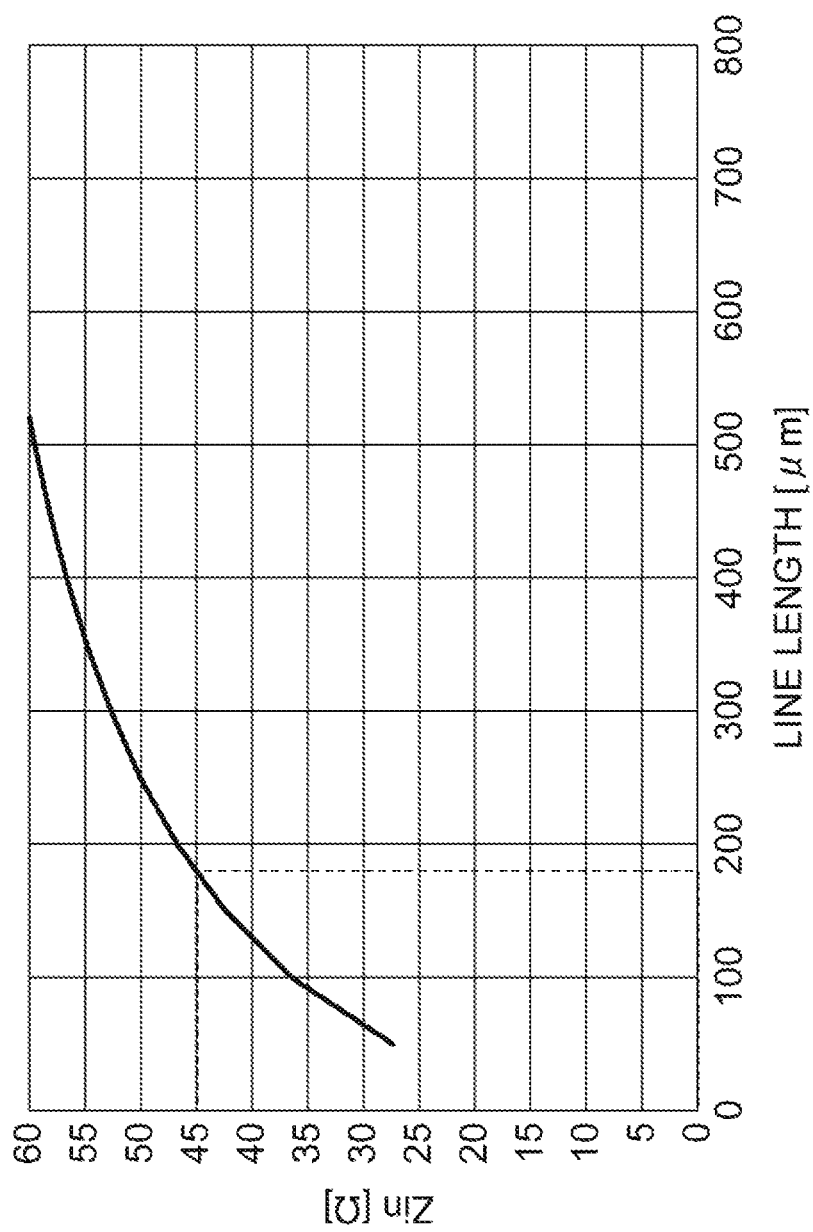
FIG. 7 is a graph illustrating a relationship between a line length of an input-side transmission line per cell and an input impedance when the amplification cell in FIG. 5 is built into the driver circuit in FIG. 2.

Next, a line length of the transmission line necessary for the traveling wave amplifier 10A including the amplification cell 12A of the embodiment will be considered. FIG. 7 illustrates a relationship between a line length of the input-side transmission line per cell and the input impedance Zin when the amplification cell 12A is built into the traveling wave amplifier. From this relationship, even when the input impedance is desired to be set to at least 45Ω or more, the line length of the input-side transmission line can be shortened to about 180 μm. Therefore, for example, in the traveling wave amplifier with six cells, impedance matching can be achieved when the line length of the transmission line is 1.08 mm, and the traveling wave amplifier can be realized with a length of 51.4% of the comparative example. As a result, a layout area occupied by the entire transmission line can be reduced from 0.294 [mm$^2$] to 0.151 [mm$^2$].

Figure 8:
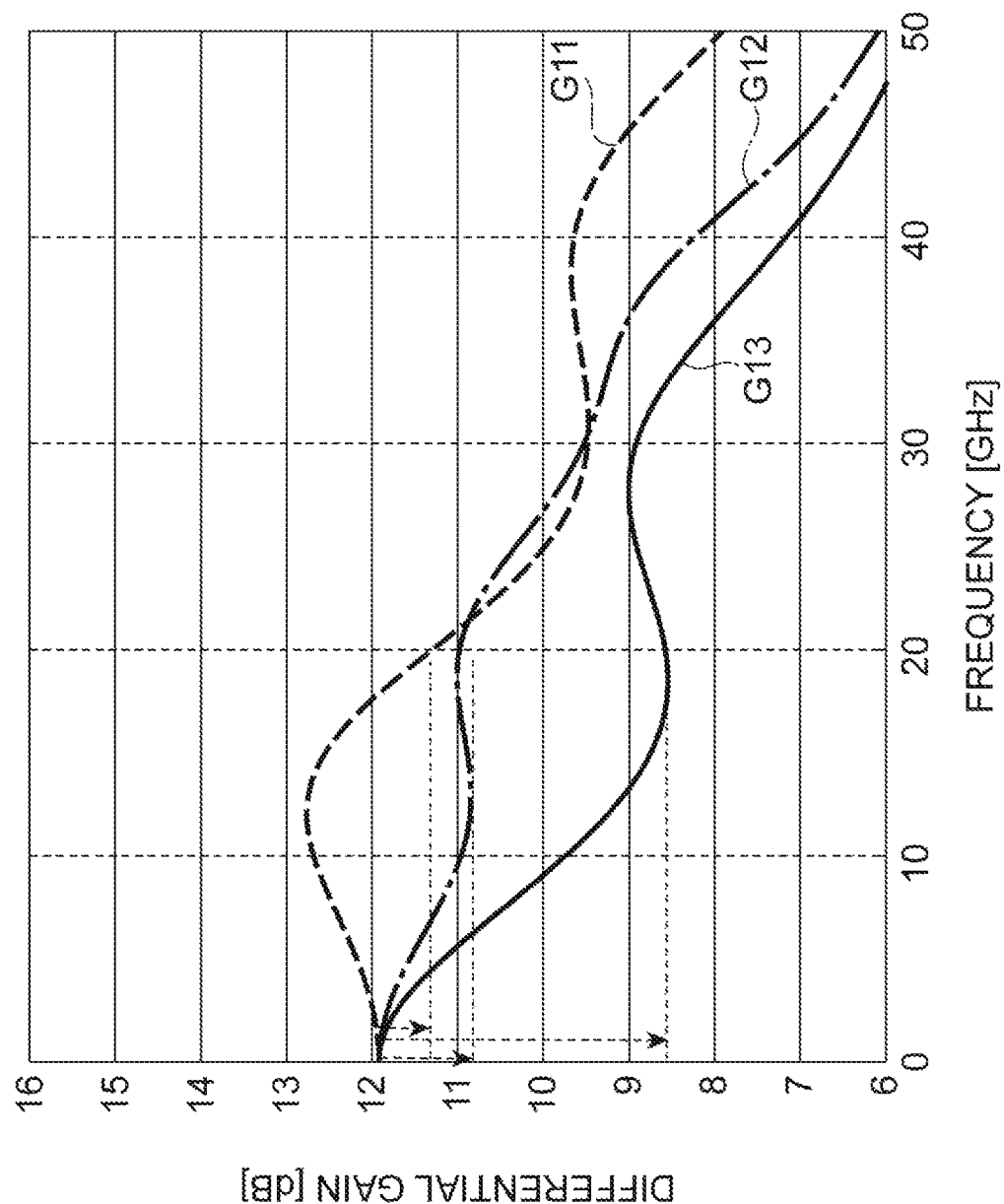
FIG. 8 is a graph illustrating frequency characteristics of a differential gain of the driver circuit according to the first embodiment.
Figure 9:
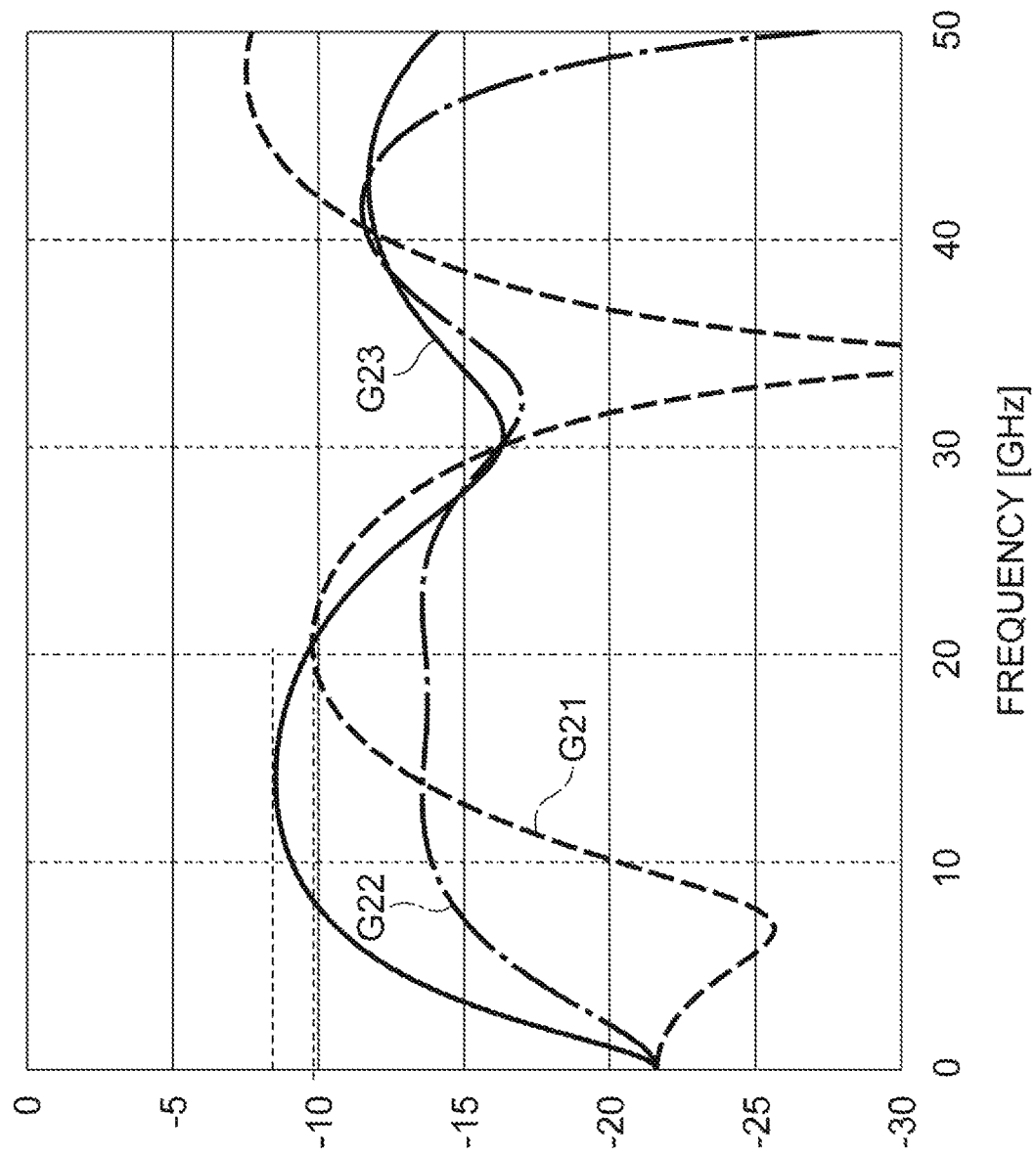
FIG. 9 is a graph illustrating frequency characteristics of a reflection coefficient of the driver circuit according to the first embodiment.

FIGS. 8 and 9 illustrate high frequency characteristics according to a circuit simulation of the traveling wave amplifier according to the first embodiment. FIG. 8 is a graph illustrating frequency characteristics of a differential gain of the traveling wave amplifier, and FIG. 9 is a graph illustrating frequency characteristics of a reflection coefficient Sdd11 according to a differential input signal of the traveling wave amplifier. In FIGS. 8 and 9, curves G11 and G21 show characteristics when a capacitance value Cf of capacitors Ca1 and Ca2 is 20 fF, a resistance value of the resistors R3 and R4 is 50Ω, and a line length of the transmission line per cell is 180 μm in a traveling wave amplifier including six amplification cells according to the embodiment. Curves G12 and G22 show characteristics of the traveling wave amplifier of the comparative example in which a line length of the transmission line per cell is 350 µm, and curves G13 and G23 show the characteristics of the traveling wave amplifier of the comparative example in which a line length of the transmission line per cell is 180 µm. It can be seen from this result that, when a comparison is performed at a differential gain at a frequency of 20 GHz when the line length of the transmission line per cell is 180 µm, a loss, which is 3.5 dB in the comparative example, is reduced to about 0.8 dB in the embodiment, and the loss can be reduced to the same amount of loss as in the comparative example in which the line length of the transmission line per cell is 350 µm. Further, in a comparison between differential reflections up to 20 GHz, when the line length of the transmission line per cell is 180 µm, the loss is −8 dB in the comparison example, whereas the loss can be reduced to −10 dB in the embodiment. Thus, in the circuit of the embodiment, it is possible to reduce a layout area of the traveling wave amplifier while maintaining frequency characteristics.

An operation and effects of the traveling wave amplifier 10A of the embodiment described above will be described.

When an optical transmitter is used for multilevel amplitude modulation transmission, an internal driver circuit for an optical modulator is required to maintain linearity between an input voltage signal and an output voltage signal (a driving signal), that is, to perform a linear amplification operation. For example, in a driver circuit that performs multilevel amplitude modulation of 32 Gbaud, high performance up to a high frequency of about 20 GHz (small gain degradation and a small input reflection coefficient) are required. Generally, in a driver circuit in which the traveling wave amplifier is adopted, it is necessary to increase the length of the transmission line included in the traveling wave amplifier in order to improve characteristics in a high frequency band, and as a result, a size of the driver circuit tends to increase.

According to the traveling wave amplifier 10A of the embodiment, the two complementary input signals transmitted through the input-side transmission lines Lin11 to Lin14 and Lin21 to Lin24 are amplified by the amplification cells 12a to 12d. Accordingly, two complementary output signals are generated in the amplification cells 12a to 12d, and are transmitted and output through the output-side transmission lines Lout11 to Lout14 and Lout21 to Lout24. Here, in the transistors Tr1 and Tr2 included in the amplification cells 12a to 12d, a series circuit SC1 including a capacitor Ca1 and a resistor R3 is connected between a base terminal for an input of the complementary input signal of one transistor and a collector terminal for an output of the complementary output signal of the other transistor, and a series circuit SC2 including a capacitor Ca2 and a resistor R4 is connected between a base terminal for an input of the complementary input signal of the other transistor and a collector terminal for an output of the complementary output signal of the one transistor. Accordingly, it is possible to apparently reduce the input capacitance of the amplification cells 12a to 12d while maintaining the gains of the amplification cells 12a to 12d. As a result, it is possible to reduce the loss and the reflection of the high frequency signal while shortening the lengths of the input-side transmission lines Lin11 to Lin14 and Lin21 to Lin24, thereby realizing a miniaturized driver circuit having excellent high frequency characteristics.

Second Embodiment

Figure 10:
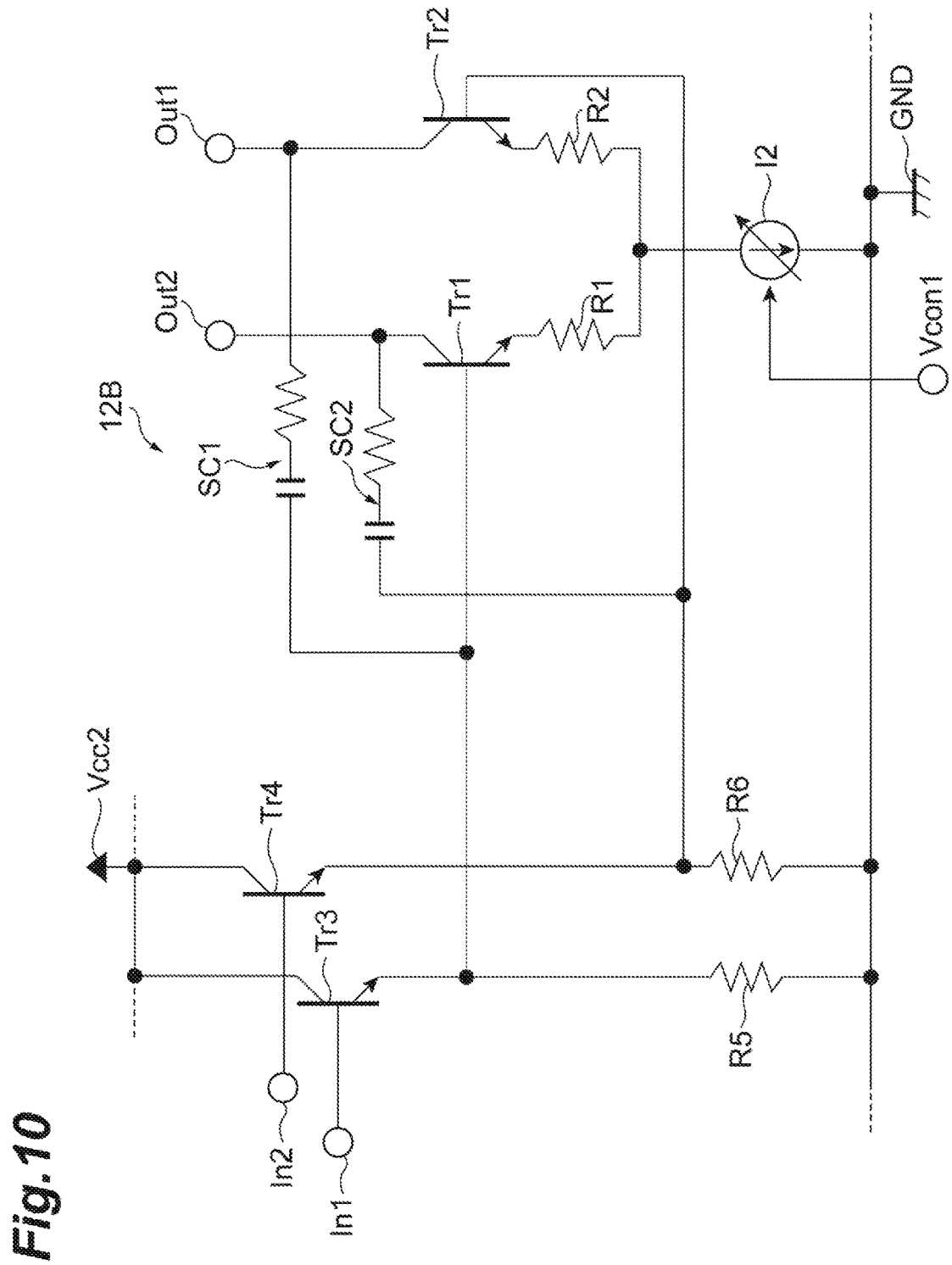
FIG. 10 is a circuit diagram illustrating a configuration of an amplification cell according to a second embodiment.

Next, a configuration of an amplification cell according to a second embodiment will be described. FIG. 10 illustrates a configuration of an amplification cell 12B according to the second embodiment. This amplifier cell 12B differs from that of the first embodiment in that emitter follower circuits are provided between the input terminals In1 and In2 and the base terminals of the transistors Tr1 and Tr2, respectively. Specifically, an emitter follower circuit (a first emitter follower circuit) including a transistor Tr3 and a resistor R5 is provided between the input terminal In1 and the transistor Tr1. That is, the input terminal In1 and the base terminal of the transistor Tr1 are connected to each other via the emitter follower circuit. The input terminal In1 is connected to a base terminal of the transistor Tr3, a collector terminal of the transistor Tr3 is connected to the power supply line Vcc2, and an emitter terminal of the transistor Tr3 is connected to the ground (GND) via the resistor R5. An emitter follower circuit (a second emitter follower circuit) including a transistor Tr4 and a resistor R6 is provided between the input terminal In2 and the transistor Tr2. That is, the input terminal In2 and the base terminal of the transistor Tr2 are connected to each other via the emitter follower circuit. The input terminal In2 is connected to a base terminal of the transistor Tr4, a collector terminal of the transistor Tr4 is connected to the power supply line Vcc2, and an emitter terminal of the transistor Tr4 is connected to the ground (GND) via the resistor R6. In the configuration, the other end of the series circuit SC1 is connected to the base terminal of the transistor Tr1 instead of the input terminal In1 and the other end of the series circuit SC2 is connected to the base terminal of the transistor Tr2 instead of the input terminal In2, unlike the first embodiment. In such a second embodiment, the emitter follower circuit allows the output impedance for driving the transistors Tr1 and Tr2 to be smaller than the input impedance of the emitter follower circuit due to an impedance conversion action of the emitter follower circuit. Accordingly, the input capacitance of the amplification cell 12B can be reduced, and as a result, the line length of the transmission line can be shortened. Further, a loss of the input signal can be further reduced, and a driver circuit having fine high frequency characteristics can be easily realized. The input capacitance of the input terminal In1 and the input capacitance of the input terminal In2 of the amplification cell 12B are substantially equal to an input capacitance of the emitter follower circuits respectively connected to the input terminals In1 and In2 As described above, the input capacitance of the amplification cell 12B can be made smaller than the input capacitance of the amplification cell 12A.

Third Embodiment

Figure 11:
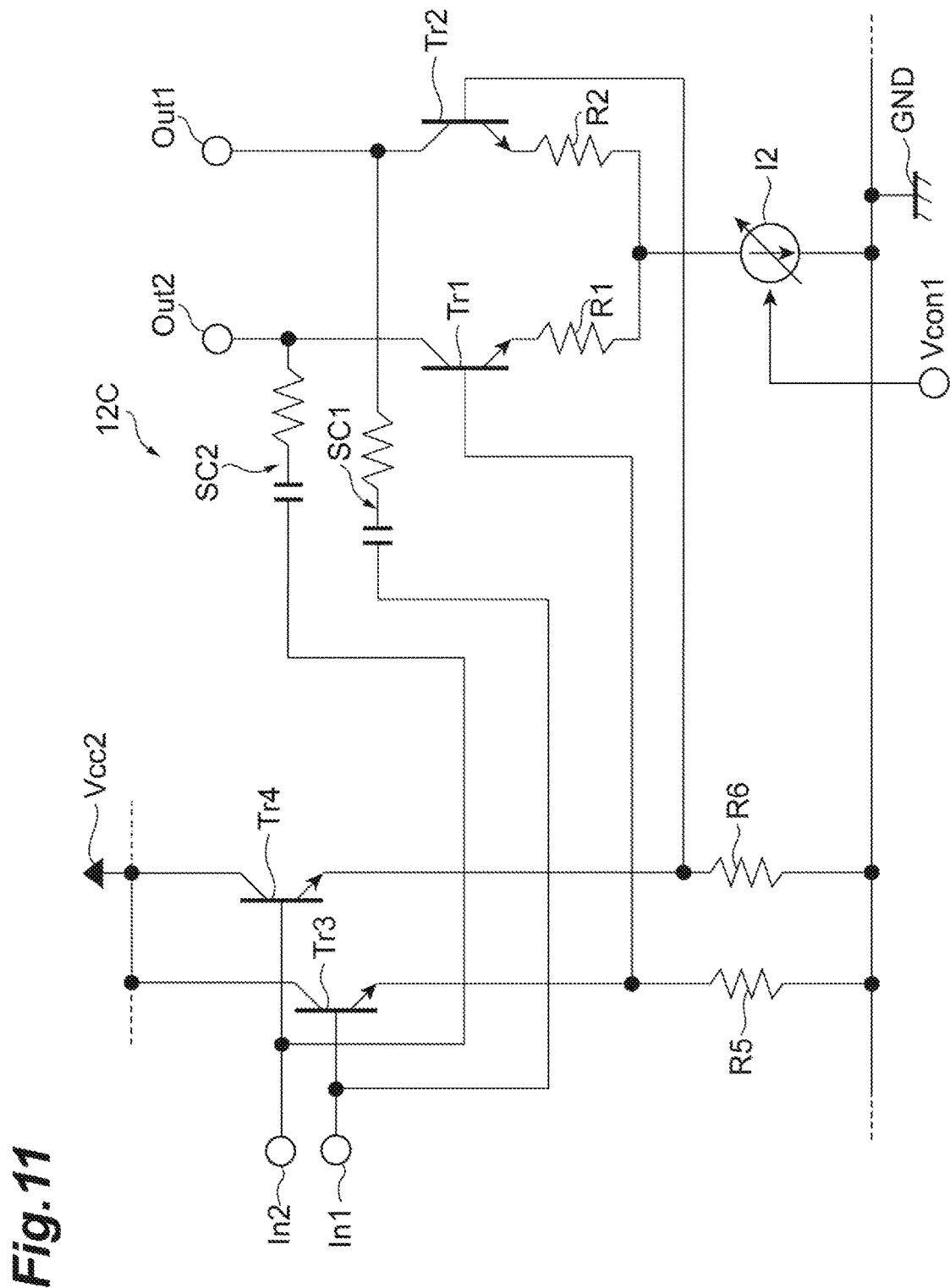
FIG. 11 is a circuit diagram illustrating a configuration of an amplification cell according to a third embodiment.

Next, a configuration of an amplification cell according to a third embodiment will be described. FIG. 11 illustrates a configuration of an amplification cell 12C according to the third embodiment. This amplifier cell 12C differs from that of the second embodiment in that series circuits SC1 and SC2 are connected between output terminals Out1 and Out2 and an input of an emitter follower circuits. That is, the series circuit SC1 is connected between a collector terminal of a transistor Tr2 and a base terminal of a transistor Tr3, and the series circuit SC2 is connected between a collector terminal of the transistor Tr1 and a base terminal of the transistor Tr4. In such a third embodiment, the input capacitance can be reduced, and as a result, a line length of a transmission line can be shortened.

Although the principles of the invention have been illustrated and described in the preferred embodiments, it will be appreciated by those skilled in the art that the present invention may be changed in arrangement and details without departing from such principles. The present invention is not limited to the specific configurations disclosed in the embodiments. For example, although the output terminals Out1 and Out2 of the amplification cell (the differential amplification circuit) are directly connected to the output-side transmission line (the first output-side transmission line) and the output-side transmission line (the second output side transmission line), respectively, in the first to third embodiments, the output terminals may be connected via a cascode transistor, for example. Accordingly, rights to all modifications and changes within the scope of the claims and the spirit thereof are claimed.

What is claimed is:

1. A driver circuit for amplifying two complementary input signals having phases opposite to each other and outputting two complementary output signals having phases opposite to each other, the driver circuit comprising:
    an input terminal for receiving the two complementary input signals;
    a first input-side transmission line for transmitting one of the two complementary input signals;
    a second input-side transmission line for transmitting the other of the two complementary input signals;
    a first output-side transmission line for transmitting one of the two complementary output signals;
    a second output-side transmission line for transmitting the other of the two complementary output signals;
    an output terminal for outputting the two complementary output signals; and
    a differential amplification circuit including
        a first input terminal electrically connected to the first input-side transmission line,
        a second input terminal electrically connected to the second input-side transmission line,
        a first transistor including a control terminal, a first current terminal, and a second current terminal, the control terminal of the first transistor being electrically connected to the first input terminal, and the second current terminal of the first transistor being electrically connected to the second output-side transmission line,
        a second transistor including a control terminal, a first current terminal, and a second current terminal, the control terminal of the second transistor being electrically connected to the second input terminal, and the second current terminal of the second transistor being electrically connected to the first output-side transmission line,
        a current source electrically connected to the first current terminal of the first transistor and the first current terminal of the second transistor,
        a first series circuit having one end electrically connected to the second current terminal of the second transistor and another end electrically connected to the first input terminal, the first series circuit including a first capacitor and a first feedback resistance element connected to the first capacitor in series,
        a second series circuit having one end electrically connected to the second current terminal of the first transistor and another end electrically connected to the second input terminal, the second series circuit including a second capacitor and a second feedback resistance element connected to the second capacitor in series, and
        a first emitter follower circuit and a second emitter follower circuit, wherein
    the first input terminal and the control terminal of the first transistor are electrically connected to each other via the first emitter follower circuit, and
    the second input terminal and the control terminal of the second transistor are electrically connected to each other via the second emitter follower circuit.

2. The driver circuit according to claim 1, wherein
    the differential amplification circuit further includes a first resistive element and a second resistive element,
    the first current terminal of the first transistor is electrically connected to one end of the current source via the first resistive element, and
    the first current terminal of the second transistor is electrically connected to the one end of the current source via the second resistive element.

3. The driver circuit according to claim 2,
    wherein the current source supplies a current having a magnitude varied according to a voltage signal.

4. The driver circuit according to claim 3, further comprising:
    another N−1 (N is an integer equal to or greater than 2) differential amplification circuits,
    wherein the differential amplification circuit and the another N−1 differential amplification circuits are electrically connected in parallel between the first input-side transmission line and the second input-side transmission line and the first output-side transmission line and the second output-side transmission line.

5. The driver circuit according to claim 4, wherein the first input-side transmission line, the second input-side transmission line, the first output-side transmission line, and the second output-side transmission line each have a characteristic impedance set between 45 and 55 Ω.

6. A driver circuit for amplifying two complementary input signals having phases opposite to each other and outputting two complementary output signals having phases opposite to each other, the driver circuit comprising:
    an input terminal for receiving the two complementary input signals;
    a first input-side transmission line for transmitting one of the two complementary input signals;
    a second input-side transmission line for transmitting another the other of the two complementary input signals;
    a first output-side transmission line for transmitting one of the two complementary output signals;
    a second output-side transmission line for transmitting the other of the two complementary output signals;
    an output terminal for outputting the two complementary output signals; and
    a differential amplification circuit including
        a first input terminal electrically connected to the first input-side transmission line,
        a second input terminal electrically connected to the second input-side transmission line,
        a first emitter follower circuit,
        a second emitter follower circuit,
        a first transistor including a control terminal, a first current terminal, and a second current terminal, the control terminal of the first transistor being electrically connected to the first input terminal via the first emitter follower circuit, and the second current terminal of the first transistor being electrically connected to the second output-side transmission line,
        a second transistor including a control terminal, a first current terminal, and a second current terminal, the control terminal of the second transistor being electrically connected to the second input terminal via the second emitter follower circuit, and the second current terminal of the second transistor being electrically connected to the first output-side transmission line,
a current source electrically connected to the first current terminal of the first transistor and the first current terminal of the second transistor,
a first series circuit having one end electrically connected to the second current terminal of the second transistor and the other end electrically connected to the control terminal of the first transistor, the first series circuit including a first capacitor and a first feedback resistance element connected to the first capacitor in series, and
a second series circuit having one end electrically connected to the second current terminal of the first transistor and the other end electrically connected to the control terminal of the second transistor, the second series circuit including a second capacitor and a second feedback resistance element connected to the second capacitor in series.

7. The driver circuit according to claim 6, further comprising:
at least a other two differential amplification circuits,
wherein the differential amplification circuit and the at least another two differential amplification circuits each have an input capacitance of the first input terminal and an input capacitance of the second input terminal thereof,
wherein the first input-side transmission line has an inductive component and a capacitive component,
wherein the input capacitance of the first input terminal, the inductive component of the first input-side transmission line, and the capacitive component of the first input-side transmission line form a distributed constant circuit,
wherein the second input-side transmission line has an inductive component and a capacitive component, and
wherein the input capacitance of the second input terminal, the inductive component of the second input-side transmission line, and the capacitive component of the second input-side transmission line form a distributed constant circuit.

8. The driver circuit according to claim 7, wherein the differential amplification circuit is configured such that the input capacitance of the first input terminal and the input capacitance of the second input terminal are larger than an output capacitance of the second current terminal of the first transistor and an output capacitance of the second current terminal of the second transistor.

* * * * *